(12) United States Patent
Cha et al.

(10) Patent No.: US 8,812,777 B2
(45) Date of Patent: Aug. 19, 2014

(54) NONVOLATILE MEMORY DEVICE

(75) Inventors: Jae-Won Cha, Gyeonggi-do (KR);
Sung-Hoon Ahn, Gyeonggi-do (KR)

(73) Assignee: Hynix Semiconductor Inc.,
Gyeonggi-do (KR)

( * ) Notice: Subject to any disclaimer, the term of this patent is extended or adjusted under 35 U.S.C. 154(b) by 246 days.

(21) Appl. No.: 13/488,897

(22) Filed: Jun. 5, 2012

(65) Prior Publication Data

US 2013/0151758 A1    Jun. 13, 2013

(30) Foreign Application Priority Data

Dec. 9, 2011    (KR) .......................... 10-2011-0132056

(51) Int. Cl.
*G06F 12/02*    (2006.01)

(52) U.S. Cl.
CPC .................................. *G06F 12/0246* (2013.01)
USPC ....................................................... 711/103

(58) Field of Classification Search
CPC ............ G06F 12/0246; G06F 12/0851; G06F 12/0866; G06F 12/0888; G06F 3/0609; G06F 3/0656; G06F 3/0679
See application file for complete search history.

(56) References Cited

U.S. PATENT DOCUMENTS

| | | | | |
|---|---|---|---|---|
| 6,826,081 | B2 * | 11/2004 | Nagashima et al. | 365/185.09 |
| 7,292,474 | B2 * | 11/2007 | Iino et al. | 365/185.03 |
| 8,286,055 | B2 * | 10/2012 | Rho | 714/768 |
| 2008/0144380 | A1 * | 6/2008 | Youn et al. | 365/185.09 |
| 2009/0296467 | A1 * | 12/2009 | Kim et al. | 365/185.03 |
| 2012/0239861 | A1 * | 9/2012 | Lee et al. | 711/103 |
| 2013/0117620 | A1 * | 5/2013 | Joo et al. | 714/746 |

* cited by examiner

*Primary Examiner* — Hiep Nguyen
(74) *Attorney, Agent, or Firm* — IP & T Group LLP

(57) ABSTRACT

A nonvolatile memory device includes: N (N is an integer equal to or greater than 2) number of nonvolatile memory cells disposed in a flag area of a page, N number of flag page buffers configured to input and output flag data to and from the nonvolatile memory cells of the flag area, and a data input/output control unit configured to select R number of flag page buffers so that the flag data is inputted and outputted from the R selected flag page buffers and no flag data is inputted and outputted through unselected N-R number of flag page buffers, wherein no one flag page buffer of the R selected flag page buffers is immediately adjacent to another one of the R selected flag page buffers.

21 Claims, 10 Drawing Sheets

FIG. 8A

| PAGE | FC<1> | FC<2> | FC<3> | FC<4> | FC<5> | FC<6> | FC<7> | FC<8> |
|---|---|---|---|---|---|---|---|---|
| CS_CNTL<1:8> | 0 | 1 | 0 | 1 | 0 | 1 | 0 | 1 |
|  | 510<1> | 510<2> | 510<3> | 510<4> | 510<5> | 510<6> | 510<7> | 510<8> |
| FLG_DATA<1:8> | 0 | | 1 | | 2 | | 3 | |

FIG. 8B

| PAGE | FCO<1> | FCE<1> | FCO<2> | FCE<2> | FCO<3> | FCE<3> | FCO<4> | FCE<4> | FCO<5> | FCE<5> | FCO<6> | FCE<6> | FCO<7> | FCE<7> | FCO<8> | FCE<8> |
|---|---|---|---|---|---|---|---|---|---|---|---|---|---|---|---|---|
| CS_CNTLO<1:8> | 0 | | 1 | | 1 | | 0 | | 0 | | 1 | | 1 | | 1 | |
| CS_CNTLE<1:8> | | 1 | | 1 | | 1 | | 1 | | 1 | | 1 | | 0 | | 1 |
|  | 610<1> | 610<2> | 610<3> | 610<4> | 610<5> | 610<6> | 610<7> | 610<8> | | | | | | | | |
| FLG_DATA<1:8> | 0 | | 1 | | 1 | | 2 | | 2 | | 3 | | 3 | | | |

FIG. 8C

| PAGE | FCO<1> | FCE<1> | FCO<2> | FCE<2> | FCO<3> | FCE<3> | FCO<4> | FCE<4> | FCO<5> | FCE<5> | FCO<6> | FCE<6> | FCO<7> | FCE<7> | FCO<8> | FCE<8> |
|---|---|---|---|---|---|---|---|---|---|---|---|---|---|---|---|---|
| W1_CS_CNTLO<1:8> | 0 | | 1 | | 1 | | 1 | | 0 | | 1 | | 1 | | 1 | |
| W1_CS_CNTLE<1:8> | | 1 | | 0 | | 1 | | 1 | | 1 | | 1 | | 0 | | 1 |
| W2_CS_CNTLO<1:8> | 1 | | 0 | | 1 | | 0 | | 1 | | 0 | | 1 | | 0 | |
| W2_CS_CNTLE<1:8> | | 1 | | 1 | | 1 | | 1 | | 1 | | 1 | | 1 | | 1 |
|  | 710<1> | 710<2> | 710<3> | 710<4> | 710<5> | 710<6> | 710<7> | 710<8> | | | | | | | | |
| FLG_DATA<1:8> | 0<WL1> | 0<WL2> | 1<WL1> | 1<WL2> | 2<WL1> | 2<WL2> | 3<WL1> | 3<WL2> | | | | | | | | |

US 8,812,777 B2

NONVOLATILE MEMORY DEVICE

CROSS-REFERENCE TO RELATED APPLICATIONS

The present application claims priority of Korean Patent Application No. 10-2011-0132056, filed on Dec. 9, 2011, which is incorporated herein by reference in its entirety.

BACKGROUND

1. Field

Exemplary embodiments of the present invention relate to semiconductor design technology, and more particularly, to a nonvolatile memory device that can maintain stored data even when a power supply is interrupted.

2. Description of the Related Art

A nonvolatile memory device, such as a NAND type flash memory device, which is able to maintain stored data even when a power supply is interrupted, may increase in storage capacity.

As the level of integration for a memory cell increases with the increase in the storage capacity, a phenomenon such as a change in a threshold value due to the potential of a floating gate of an adjacent cell may occur. Such a change in a threshold value is referred to as a proximity effect.

The proximity effect changes the threshold value of a memory cell for writing data into the memory cell. The proximity effect is an obstacle when narrowing a threshold value distribution width and is regarded as one of factors that make it difficult to increase the storage capacity of a nonvolatile memory device.

SUMMARY

An embodiment of the present invention is directed to a nonvolatile memory device that can effectively prevent inter-cell interference.

In accordance with an embodiment of the present invention, a nonvolatile memory device includes: N (N is an integer equal to or greater than 2) number of nonvolatile memory cells disposed in a flag area of a page, N number of flag page buffers configured to input and output flag data to and from the nonvolatile memory cells of the flag area, and a data input/output control unit configured to select R number of flag page buffers so that the flag data is inputted and outputted from the R selected flag page buffers and no flag data is inputted and outputted through unselected N-R number of flag page buffers, wherein no one flag page buffer of the R selected flag page buffers is immediately adjacent to another one of the R selected flag page buffers.

In accordance with another embodiment of the present invention, a nonvolatile memory device includes: K (K is an integer equal to or greater than 1) number of pages each including N (N is an integer equal to or greater than 2) number of nonvolatile memory cells disposed in a flag area, wherein the K number of pages are accessed by a word line, N number of flag page buffers configured to input and output flag data to and from K*N number of nonvolatile memory cells in correspondence to the flag areas of the K number of pages, and a data input/output control unit configured to select R number of flag page buffers so that the flag data is inputted and outputted from the R selected flag page buffers and no flag data is inputted and outputted through unselected N-R number of flag page buffers, wherein no one flag page buffer of the R selected flag page buffers is immediately adjacent to another one of the R selected flag page buffers.

In accordance with another embodiment of the present invention, a nonvolatile memory device includes: a first word line accessing K (K is an integer equal to or greater than 1) number of pages each including N (N is an integer equal to or greater than 2) number of nonvolatile memory cells disposed in a corresponding flag area, a second word line accessing K number of pages each including N number of nonvolatile memory cells disposed in a corresponding flag area, wherein the second word line is adjacent to the first word line, N number of flag page buffers configured to input and output flag data to and from K*N number of nonvolatile memory cells in correspondence to the flag areas of the K number of pages accessed by the first word line or the second word line, and a data input/output control unit configured to select a first group of flag page buffers in the flag areas of the K number of pages accessed by the first word line and select a second group of flag page buffers in the flag areas of the K number of pages accessed by the second word line so that the flag data is inputted and outputted from the first and second group of selected flag page buffers and no flag data is inputted and outputted through unselected flag page buffers, wherein no one flag page buffer of the first group is immediately adjacent to another one of the first group of selected flag page buffers, and no one flag page buffer of the second group is immediately adjacent to another one of the second group of selected flag page buffers.

BRIEF DESCRIPTION OF THE DRAWINGS

FIGS. 8A and 9A are a table and a diagram illustrating operations of the nonvolatile memory device in accordance with the first embodiment of the present invention shown in FIG. 5.

FIGS. 8B and 9B are a table and a diagram illustrating operations of the nonvolatile memory device in accordance with the second embodiment of the present invention shown in FIG. 6.

FIGS. 8C and 9C are a table and a diagram illustrating operations of the nonvolatile memory device in accordance with the third embodiment of the present invention shown in FIG. 7.

DETAILED DESCRIPTION

Figure 1A:
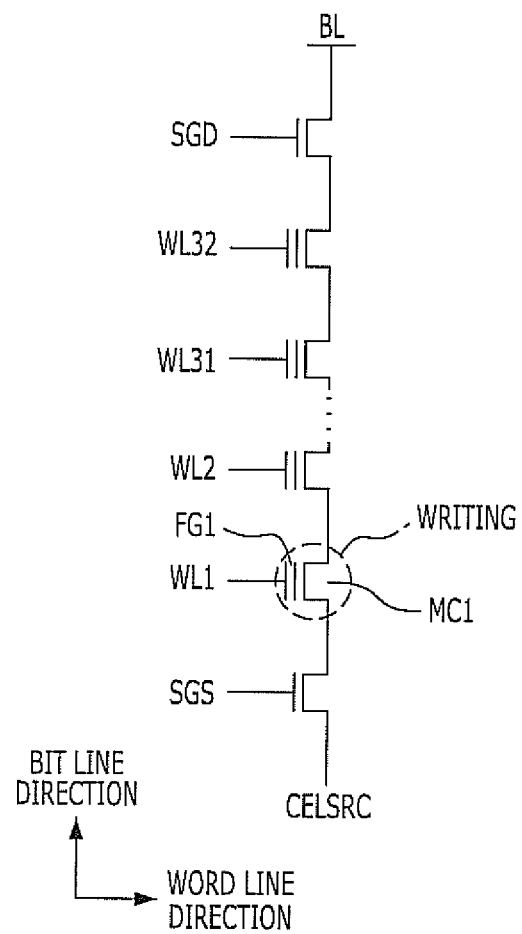
FIGS. 1A and 1B are diagrams illustrating data writing to memory cells.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Before describing exemplary embodiments of the present invention, a proximity effect and a correction unit for correcting the proximity effect will be described briefly.

Figure 1B:
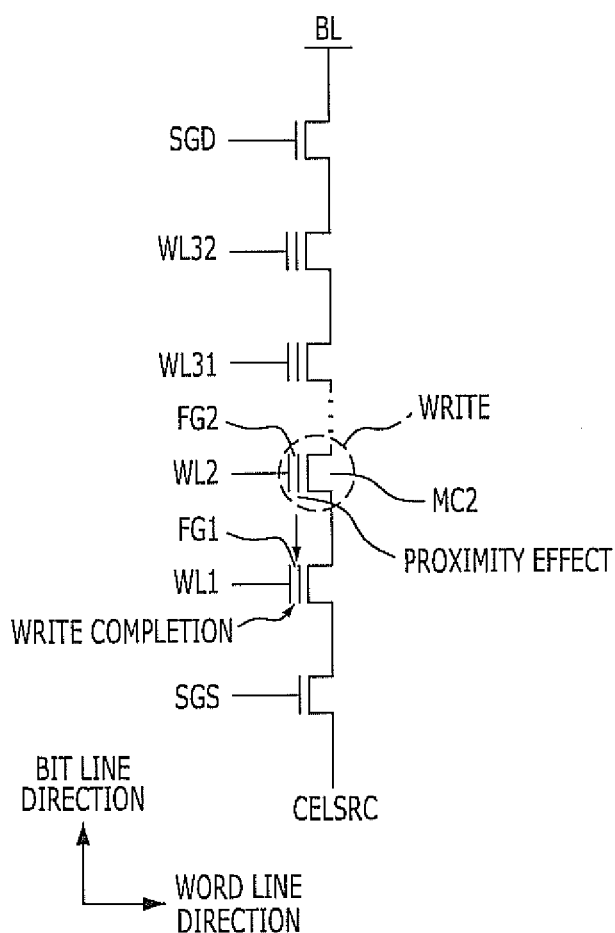

A nonvolatile semiconductor memory, for example, a NAND type flash memory, writes data by a page. More specifically, if a writing operation for one page is completed, a writing operation for a next page is implemented. Pages may be set by a word line. For example, if data is written to a memory cell MC1 that is connected to a word line WL1 (see FIG. 1A), data is subsequently written to a memory cell MC2 that is connected to a word line WL2 (see FIG. 1B).

Figure 2:
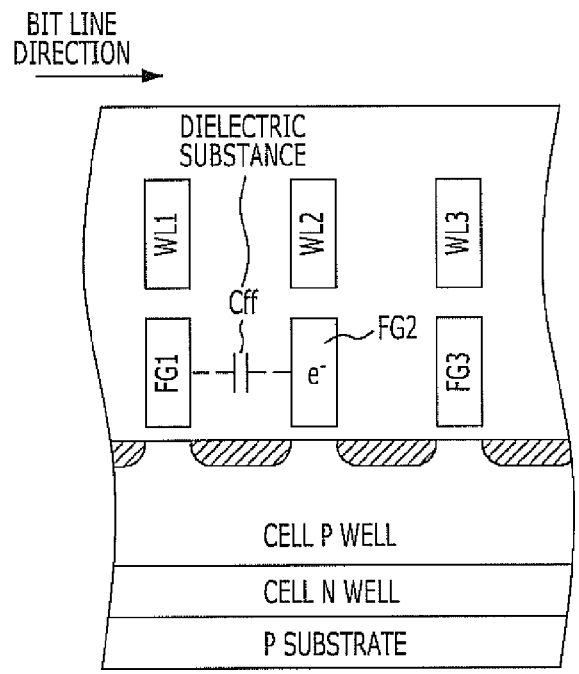
FIG. 2 is a cross-sectional view taken along the bit line direction of memory cells.

In the following example, it is assumed that data "0" is written to the memory cell MC2. If data "0" is written, electrons e– are introduced into the charge accumulation layer, for example, a floating gate FG2 of the memory cell MC2, and the potential of the floating gate FG2 decreases. The floating gate FG2 is disposed adjacent to a floating gate FG1 of the memory cell MC1, and a dielectric substance is interposed between the memory cell MC1 and the memory cell MC2 (see FIG. 2). The floating gate FG2 is coupled with the floating gate FG1 of the memory cell MC1 through a parasitic capacitance Cff. If the potential of the floating gate FG2 decreases, the floating gate FG1 is capacity-coupled with the floating gate FG2, and the potential of the floating gate FG1 decreases. The memory cell MC1 is a memory cell where a writing operation is completed. If the potential of the floating gate FG1 of the memory cell MC1 decreases, the threshold value (Vth) of the memory cell MC1 is changed. The change in the threshold value of the memory cell is referred to as a proximity effect. A threshold value distribution Dw of a memory cell before a proximity effect occurs is shown in FIG. 3A, and a threshold value distribution Dw' of the memory cell after the proximity effect occurs is shown in FIG. 3B.

Figure 3A:
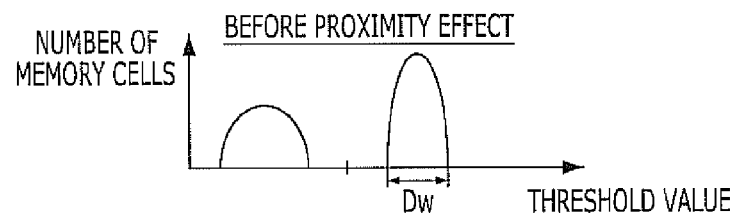
FIGS. 3A and 3B are graphs illustrating threshold voltage distributions before and after a proximity effect occurs.
Figure 3B:
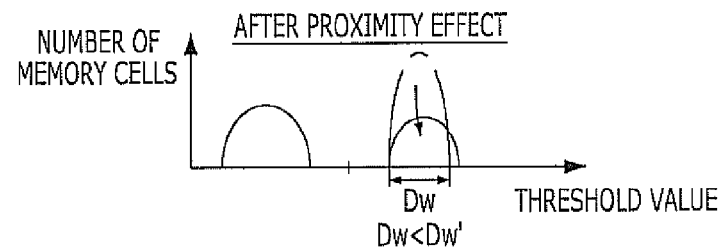

As can be seen from FIGS. 3A and 3B, the proximity effect increases the threshold value distribution of the memory cell where the writing operation is completed. This increase in the threshold value distribution makes controlling a threshold value distribution within a target range difficult.

Figure 4:
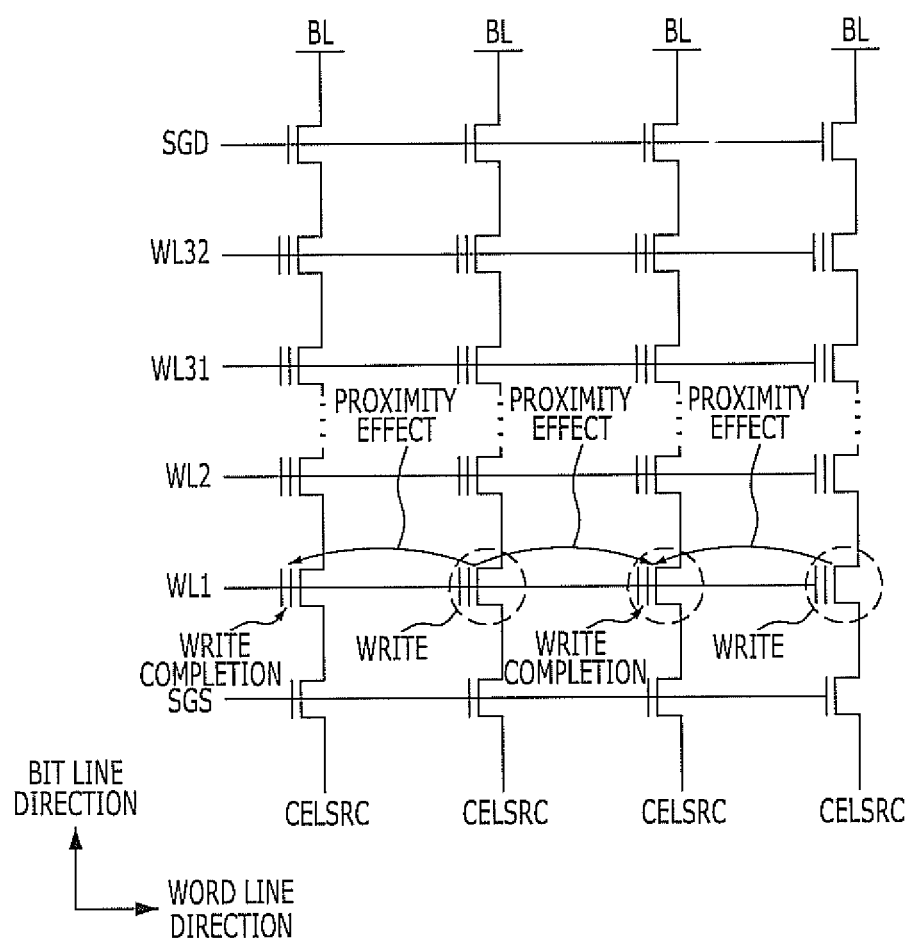
FIG. 4 is a diagram illustrating writing data to memory cells.

The proximity effect occurs not only between memory cells that are adjacent in a bit line direction but also between memory cells that are adjacent in a word line direction. For example, a NAND type flash memory, in which data writing is alternately implemented for an even-numbered bit line BLe and an odd-numbered bit line BLo, may be exemplified (see FIG. 4). In such a NAND type flash memory, a proximity effect also occurs between memory cells that are adjacent in the word line direction.

With the increase in the integration of the nonvolatile semiconductor memory, storing information of at least 3 bits in one memory cell has been adopted. A multi-bit NAND type flash memory has a wide threshold value distribution when compared to a 2-bit NAND type flash memory. While the 2-bit NAND type flash memory is likely to be influenced by the proximity effect, the multi-bit NAND type flash memory is further likely to be influenced by the proximity effect.

For example, 4-bit NAND type flash memory forms three threshold value distributions between an erased-state threshold value distribution and an intermediate voltage (Vpass). The respective threshold value distributions are narrow. If memory cells are influenced by the proximity effect, the threshold value distributions are likely to overlap with one another. If the threshold value distributions overlap with one another, data may not be precisely stored.

First Embodiment

Figure 5:
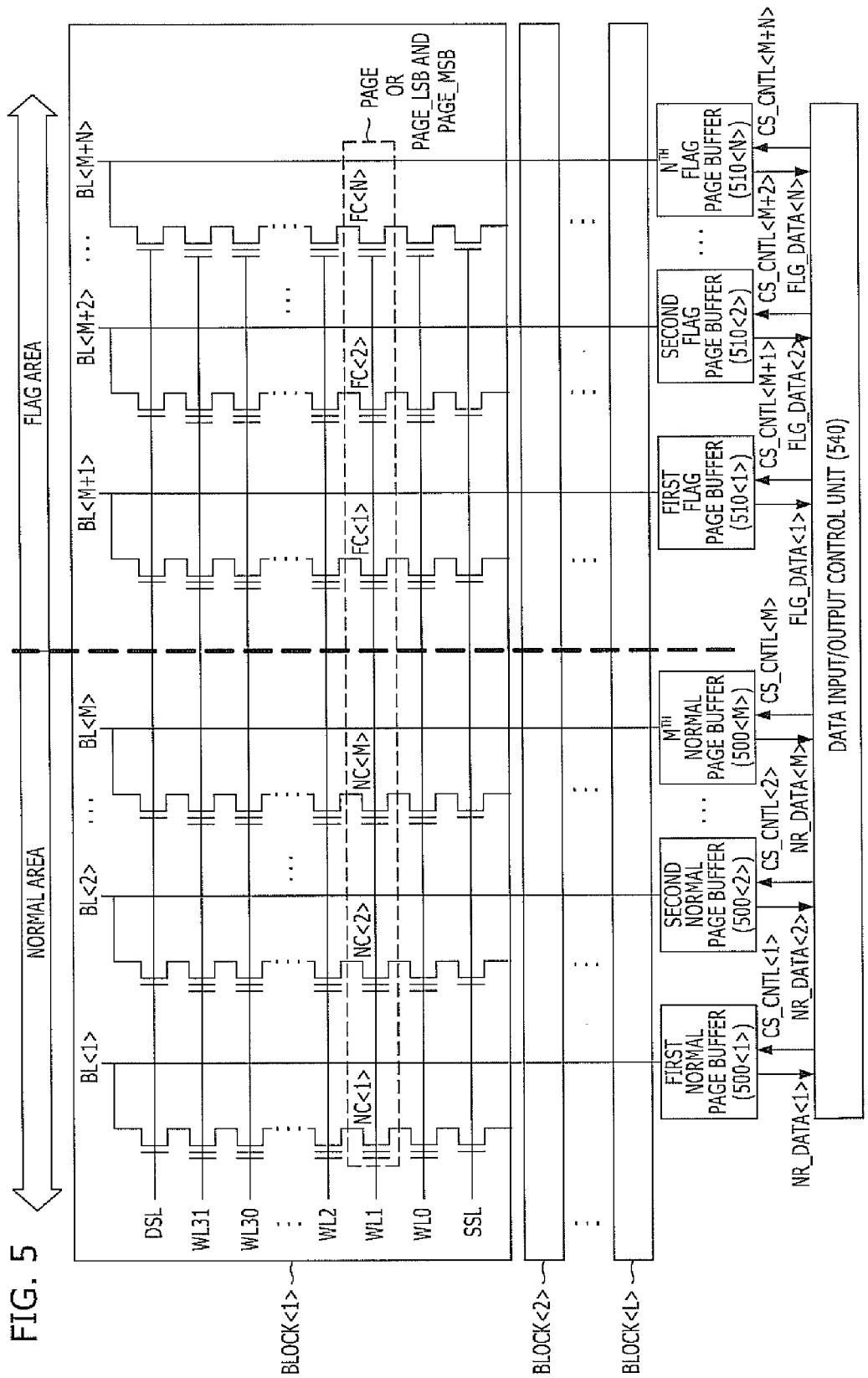
FIG. 5 is a block diagram illustrating the configuration of a nonvolatile memory device in accordance with a first embodiment of the present invention.

FIG. 5 is a block diagram illustrating the configuration of a nonvolatile memory device in accordance with a first embodiment of the present invention.

Referring to FIG. 5, a nonvolatile memory device in accordance with a first embodiment of the present invention includes a page PAGE, M number of normal page buffers 500<1:M>, N number of flag page buffers 510<1:N>, and a data input/output control unit 540.

For reference, a plurality of blocks BLOCK<1:L> are included in a memory cell array of the nonvolatile memory device. A plurality of word lines WL<0:31> and a plurality of bit lines BL<1:M> and BL<M+1:M+N> are arranged in an array type in each of the plurality of blocks BLOCK<1:L>, and nonvolatile memory cell transistors are disposed at respective crossing points. When each of a plurality of memory cell transistors NC<1:M> and FC<1:N> connected to each word line of the plurality of word lines WL<0:31> can store 1-bit data, and data reading and writing are simultaneously performed for, the plurality of memory cells NC<1:M> and FC<1:N> connected to each word line, each word line becomes one page PAGE. Also, when each of the plurality of memory cell transistors NC<1:M> and FC<1:N> connected to each word line of the plurality of word lines WL<0:31> is can store 2-bit data, and data reading and writing are simultaneously performed for the plurality of memory cells NC<1:M> and FC<1:N> connected to each word line, each word line becomes two pages PAGE_LSB and PAGE_MSB.

In this way, the unit referred to as a page in a nonvolatile memory device means a minimum unit for which data reading and writing are simultaneously performed. Accordingly, although the nonvolatile memory device in accordance with the first embodiment of the present invention includes a plurality of pages, since all the pages have the same operational characteristics, operations of the nonvolatile memory device will be described below with respect to one representative page.

First, one page PAGE includes a normal area NORMAL AREA in which the M number of nonvolatile memory cells NC<1:M> are disposed and a flag area FLAG AREA in which the N number of nonvolatile memory cells FC<1:N> are disposed. Here, M may be an integer equal to or greater than 2, and N may also be an integer equal to or greater than 2.

Normal data NR_DATA<1:M>, which is inputted to and outputted from the normal area NORMAL AREA of the page PAGE, may be changed in value by a user. In other words, the data applied to the nonvolatile memory device by the user is the normal data NR_DATA<1:M> that is stored in the normal area NORMAL AREA of the page PAGE, and the data outputted from the nonvolatile memory device according to the user's need is the normal data NR_DATA<1:M> that is outputted from the normal area NORMAL AREA of the page PAGE.

Conversely, flag data FLG_DATA<1:N>, which is inputted to and outputted from the flag area FLAG AREA of the page PAGE, may be changed in value according to the current state of the page PAGE. More specifically, in the flag area FLAG AREA of the page PAGE, the data input/output control unit 540 of the nonvolatile memory device determines the values of the flag data FLG_DATA<1:N> in response to the current state of a corresponding page. The user may not access the flag area FLAG AREA.

The flag data FLG_DATA<1:N> is data that indicates to which stage a writing operation is performed to the corresponding page. Accordingly, by reading the flag data FLG_DATA<1:N>, to which stage the writing operation is performed to the corresponding page may be determined. By reading the flag data FLG_DATA<1:N>, the verify reading voltage of the corresponding page may be controlled.

For reference, while the normal area NORMAL AREA and the flag area FLAG AREA of the page PAGE are shown as having the same size, this is for illustration purposes, and actually, the normal area NORMAL AREA of the page PAGE is remarkably larger than the flag area FLAG AREA of the page PAGE. As a result, the dimension and the number of nonvolatile memory cells of the normal area NORMAL AREA of the page PAGE are significantly different from those of the flag area FLAG AREA of the page PAGE. For example, when the number of nonvolatile memory cells NC<1:M> included in the normal area NORMAL AREA of the page PAGE is 8 Kbytes, the number of nonvolatile memory cells FC<1:N> included in the flag area FLAG AREA of the page PAGE is 4 Bytes.

In order to write and read the normal data NR_DATA<1:M> to and from the M number of nonvolatile memory cells NC<1:M> included in the normal area NORMAL AREA of the page PAGE, M number of normal page buffers 500<1:M> are disposed.

The M number of normal page buffers 500<1:M> are controlled by the data input/output control unit 540.

In detail, when an operation for inputting/outputting the normal data NR_DATA<1:M> is performed, the data input/output control unit 540 selects (enables) all the M number of normal page buffers 500<1:M> such that all the M-bit normal data NR_DATA<1:M> may be simultaneously inputted/outputted.

Further, in order to write and read the flag data FLG_DATA<1:N> to and from the N number of nonvolatile memory cells FC<1:N> included in the flag area FLAG AREA of the page PAGE, N number of flag page buffers 510<1:N> are disposed.

Also, the N number of flag page buffers 510<1:N> are controlled by the data input/output control unit 540.

In detail, when an operation for inputting/outputting the flag data FLG_DATA<1:N> is performed, the data input/output control unit 540 selects (enables) R number of flag page buffers 510<1:R> among the N number of flag page buffers 510<1:N> that are not adjacent to one another such that R-bit flag data is inputted/outputted. In addition, the data input/output control unit 540 does not select (disables) N−R number of flag page buffers such that flag data is not inputted/outputted.

For example, when an operation for inputting/outputting the flag data FLG_DATA<1:N> is performed, the data input/output control unit 540 selects odd-numbered flag page buffers 510<1>, 510<3>, 510<5>, . . . and 510<N−1> among the N number of flag page buffers 510<1:N> such that N/2-bit flag data FLG_DATA<1>, FLG_DATA<3>, FLG_DATA<5>, . . . and FLG_DATA<N−1> is inputted/outputted, and flag data is not inputted/outputted to and from unselected even-numbered flag page buffers 510<2>, 510<4>, 510<6>, . . . and 510<N>.

Conversely, when an operation for inputting/outputting the flag data FLG_DATA<1:N> is performed, the data input/output control unit 540 selects even-numbered flag page buffers 510<2>, 510<4>, 510<6>, . . . and 510<N> among the N number of flag page buffers 510<1:N> such that N/2-bit flag data FLG_DATA<2>, FLG_DATA<4>, FLG_DATA<6>, . . . and FLG_DATA<N> is inputted/outputted, and flag data is not inputted/outputted to and from unselected odd-numbered flag page buffers 510<1>, 510<3>, 510<5>, . . . and 510<N−1>.

In order to operate the data input/output control unit 540 as described above, a method of controlling the values of cell select control signals CS_CNTL<M+1:M+N> capable of respectively selecting the N number of nonvolatile memory cells FC<1:N> included in the flag area FLAG AREA of the page PAGE may be used. More specifically, by controlling the values of the cell select control signals CS_CNTL<M+1:M+N> capable of respectively selecting the N number of nonvolatile memory cells FC<1:N> included in the flag area FLAG AREA of the page PAGE, the odd-numbered flag page buffers 510<1>, 510<3>, 510<5>, . . . and 510<N−1> among the N number of flag page buffers 510<1:N> may input/output the N/2-bit flag data FLG_DATA<1>, FLG_DATA<3>, FLG_DATA<5>, . . . and FLG_DATA<N−1> or the even-numbered flag page buffers 510<2>, 5104>, 510<6>, . . . and 510<N> among the N number of flag page buffers 510<1:N> may input/output the N/2-bit flag data FLG_DATA<2>, FLG_DATA<4>, FLG_DATA<6>, . . . and FLG_DATA<N>.

For example, as shown in FIG. 8A, if cell select control signals CS_CNTL<1:8> with values of '0 1 0 1 0 1 0 1' are applied, odd-numbered flag page buffers 510<1>, 510<3>, 510<5>, and 510<7> are selected among eight flag page buffers 510<1:8> corresponding to eight nonvolatile memory cells FC<1:8> included in the flag area FLAG AREA of the page PAGE such that 4-bit flag data FLG_DATA<1>, FLG_DATA<3>, FLG_DATA<5>, and FLG_DATA<7> is inputted and outputted to and from odd-numbered nonvolatile memory cells FC<1>, FC<3>, FC<5> and FC<7>. In this example, data is not inputted and outputted through unselected even-numbered flag page buffers 510<2>, 510<4>, 510<6>, and 510<8>.

Accordingly, among the eight nonvolatile memory cells FC<1:8> included in the flag area FLAG AREA of the page PAGE, the cells FC<2>, FC<4>, FC<6>, and FC<8> in which no data is stored exist between the cells FC<1>, FC<3>, FC<5>, and FC<7> in which the 4-bit flag data FLG_DATA<1>, FLG_DATA<3>, FLG_DATA<5> and FLG_DATA<7> is stored. In this configuration, the occurrence of an interference phenomenon between adjacent cells may be minimized while the 4-bit flag data FLG_DATA<1>, FLG_DATA<3>, FLG_DATA<5>, and FLG_DATA<7> is stored.

Similarly, while not shown in a drawing, if the cell select control signals CS_CNTL<1:8> with values of '0 1 0 1 0 1 0 1' is applied, the even-numbered flag page buffers 510<2>, 510<4>, 510<6>, and 510<8> are selected among the eight flag page buffers 510<1:8> corresponding to the eight nonvolatile memory cells FC<1:8> included in the flag area FLAG AREA of the page PAGE such that 4-bit flag data FLG_DATA<2>, FLG_DATA<4>, FLG_DATA<6>, and FLG_DATA<8> is inputted and outputted to and from the even-numbered nonvolatile memory cells FC<2>, FC<4>, FC<6>, and FC<8>. In this example, data is not inputted and outputted through the unselected odd-numbered flag page buffers 510<1>, 510<3>, 510<5>,m and 510<7>.

Accordingly, among the eight nonvolatile memory cells FC<1:8> included in the flag area FLAG AREA of the page PAGE, the cells FC<1>, FC<3>, FC<5>, and FC<7> in which no data is stored exist between the cells FC<2>, FC<4>, FC<6>, and FC<8> in which the 4-bit flag data FLG_DATA<2>, FLG_DATA<4>, FLG_DATA<6>, and FLG_

DATA<8> is stored. In this configuration, the occurrence of an interference phenomenon between adjacent cells may be minimized while the 4-bit flag data FLG_DATA<2>, FLG_DATA<4>, FLG_DATA<6>, and FLG_DATA<8> is stored.

Figure 9A:
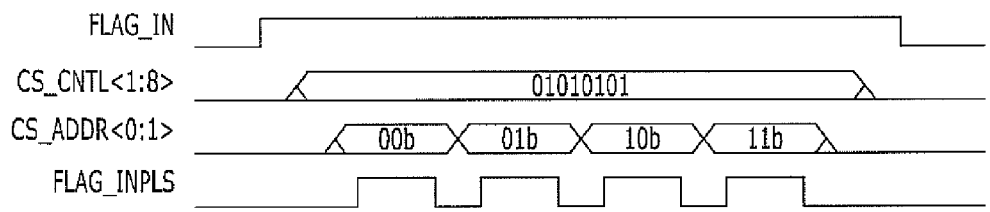

In this way, when the number of nonvolatile memory cells included in the flag area FLAG AREA of the page PAGE is increased to 32 as FC<1:32>, as shown in FIG. 9A, through a method of counting cell select addresses CS_ADDR<0:1> in the sequence of 00b, 01b, 10b and 11b with the values of the cell select control signals CS_CNTL<1:8> controlled, odd-numbered flag page buffers 510<1>, 510<3>, 510<5>, . . . and 510<31> among thirty-two flag page buffers 510<1:32> included in the flag area FLAG AREA of the page PAGE may input/output 16-bit flag data FLG_DATA<1>, FLG_DATA<3>, FLG_DATA<5>, . . . and FLG_DATA<31>, or even-numbered flag page buffers 510<2>, 510<4>, 510<6>, . . . and 510<32> among the thirty-two flag page buffers 510<1:32> included in the flag area FLAG AREA of the page PAGE may input/output 16-bit flag data FLG_DATA<2>, FLG_DATA<4>, FLG_DATA<6>, . . . and FLG_DATA<32>.

The normal data NR_DATA<1:M> may be stored each by multiple bits in the M number of nonvolatile memory cells NC<1:M> included in the normal area NORMAL AREA of the page PAGE, and the flag data FLG_DATA<1:N> may be stored each by two bits in the N number of nonvolatile memory cells FC<1:N> included in the flag area FLAG AREA of the page PAGE. More specifically, in the normal data NR_DATA<1:M>, since an amount of data to be stored is an important goal, a configuration capable of storing more data may be used, and in the flag data FLG_DATA<1:N>, since accuracy of data to be read is an important goal, a configuration with less probability of an error occurring may be used.

Figure 10A:
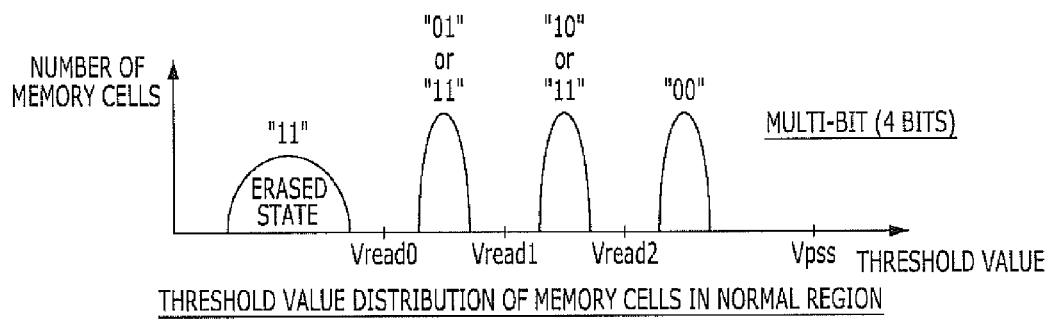
FIG. 10A is a graph illustrating an example of a threshold voltage distribution of memory cells in a normal portion.
Figure 10B:
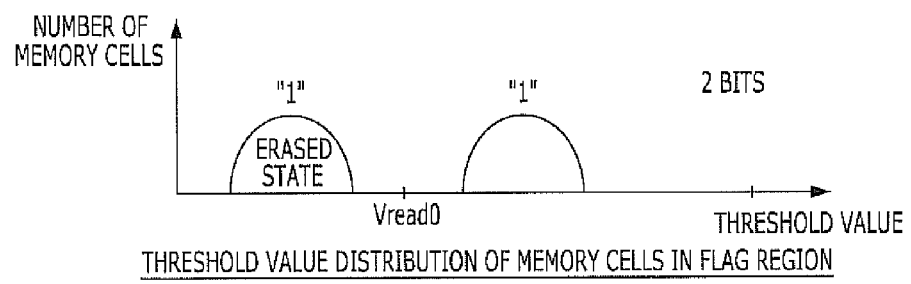
FIG. 10B is a graph illustrating an example of a threshold voltage distribution of memory cells in a page flag area.

FIG. 10A illustrates an example of a threshold voltage distribution of the M number of nonvolatile memory cells NC<1:M> included in the normal area NORMAL AREA, and FIG. 10B illustrates an example of a threshold voltage distribution of the N number of nonvolatile memory cells FC<1:N> included in the flag area FLAG AREA.

Referring to FIG. 10B, the initial state of the N number of nonvolatile memory cells FC<1:N> included in the flag area FLAG AREA of the page PAGE corresponds, for example, to a case in which the flag data FLG_DATA<1:N> becomes "1" (=an erased state). This state represents, for example, a state in which writing of the normal data NRDATA<1:M> to be stored in the normal area NORMAL AREA of the page PAGE is not completed. In this way, by reading the flag data FLG_DATA<1:N> from the N number of nonvolatile memory cells FC<1:N> included in the flag area FLAG AREA of the page PAGE, if the values of the flag data FLG_DATA<1:N> are "1", the writing of the normal data NR_DATA<1:M> to be stored in the normal area NORMAL AREA of the page PAGE is not completed.

Thereafter, if the writing of the normal data NR_DATA<1:M> to be stored in the normal area NORMAL AREA of the page PAGE is completed, electrons are introduced into the floating gates of cells (odd-numbered or even-numbered cells) selected among the N number of nonvolatile memory cells FC<1:N> included in the flag area FLAG AREA of the page PAGE, and the threshold values of the flag cells are raised from the erased state of "1" to a written state of "0". By reading the flag data FLG_DATA<1, 3, 5, . . . , N–1> or FLG_DATA<2, 4, 6, . . . , N> from the cells selected among the N number of nonvolatile memory cells FC<1:N> included in the flag area FLAG AREA of the page PAGE, whether the writing of the normal data NRDATA<1:M> to be stored in the normal area NORMAL AREA of the PAGE is completed may be determined.

In addition, when the values of the flag data FLG_DATA<1, 3, 5, . . . , N–1> or FLG_DATA<2, 4, 6, . . . , N> read from the cells selected among the N number of nonvolatile memory cells FC<1:N> included in the flag area FLAG AREA of the page PAGE are "0", the values of the flag data FLG_DATA<2, 4, 6, . . . N> or FLG_DATA<1, 3, 5, . . . N–1> read from the unselected cells may be maintained as "1".

However, if the values of the flag data FLG_DATA<2, 4, 6, . . . , N> or FLG_DATA<1, 3, 5, . . . , N–1> read from the unselected cells become "0", an interference phenomenon occurred in the unselected cells.

In this way, if the interference phenomenon is known by reading the values of the flag data FLG_DATA<2, 4, 6, . . . , N> or FLG_DATA<1, 3, 5, . . . , N–1> from the unselected cells, the interference phenomenon may be offset through a method of controlling the level of a read reference voltage Vread while reading the flag data FLG_DATA<1, 3, 5, . . . N-1> or FLG_DATA<2, 4, 6, . . . , N> of the selected cells.

Second Embodiment

Figure 6:
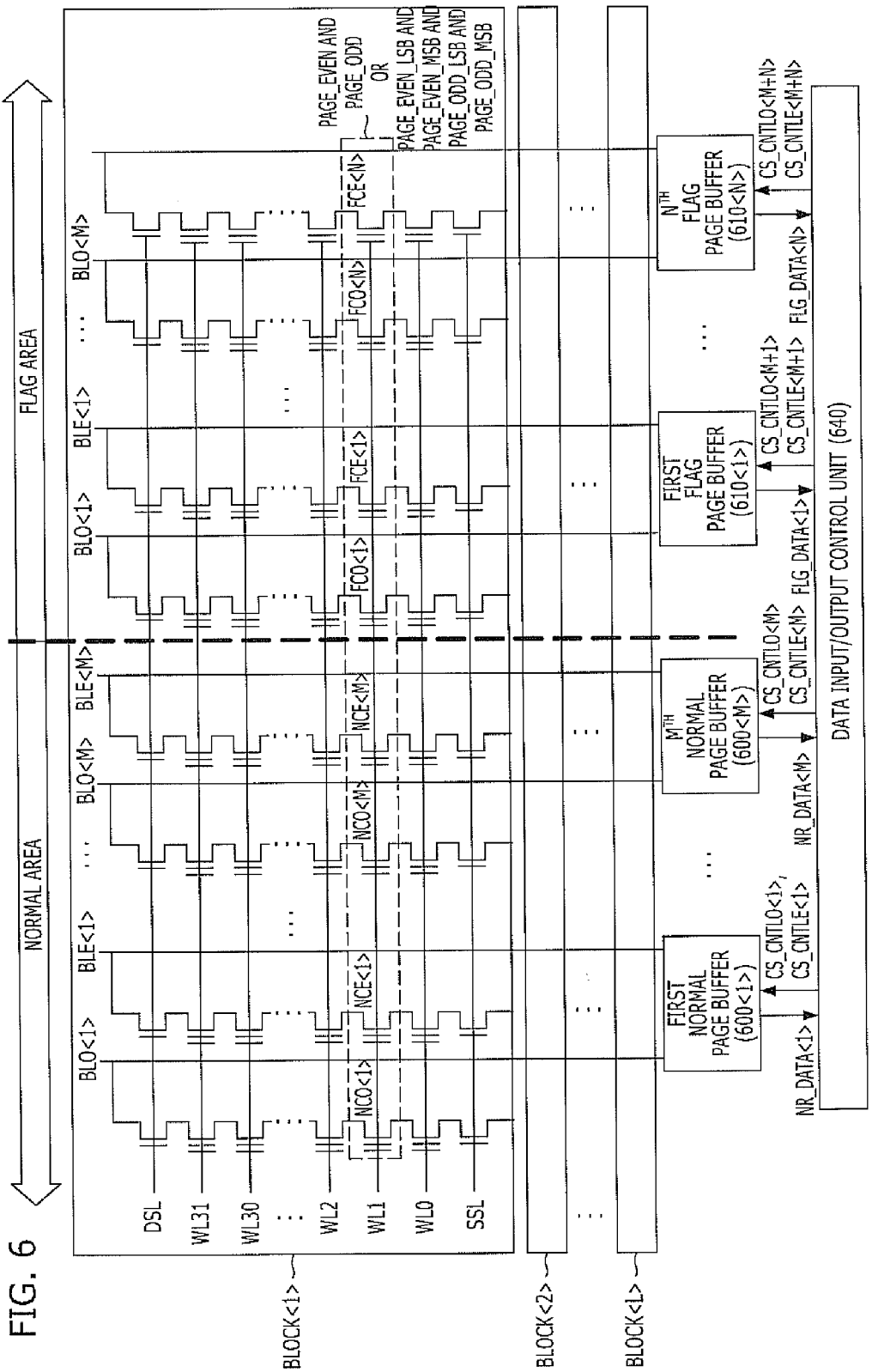
FIG. 6 is a block diagram illustrating the configuration of a nonvolatile memory device in accordance with a second embodiment of the present invention.

FIG. 6 is a block diagram illustrating the configuration of a nonvolatile memory device in accordance with a second embodiment of the present invention.

Referring to FIG. 6, a nonvolatile memory device in accordance with a second embodiment of the present invention includes a word line WL<1>, M number of normal page buffers 600<1:M>, N number of flag page buffers 610<1:N>, and a data input/output control unit 640. The word line WL<1> includes K number of pages PAGE<1:K>.

For reference, a plurality of blocks BLOCK<1:L> are included in a memory cell array of the nonvolatile memory device. A plurality of word lines WL<0:31> and a plurality of bit lines BL_EVEN<1:M>, BL_ODD<1:M>, BL_EVEN<M+1:M+N> and BL_ODD<M+1:M+N> are arranged in an array type in each of the plurality of blocks BLOCK<1:L>, and nonvolatile memory cell transistors are disposed at respective crossing points. When each of a plurality of memory cell transistors NCE<1:M>, NCO<1:M>, FCE<1:N>, and FCO<1:N> connected to each word line of the plurality of word lines WL<0:31> can store 1-bit data, data reading and writing are simultaneously performed for odd-numbered cell transistors NCO<1:M> and FCO<1:N> among the plurality of memory cell transistors NCE<1:M>, NCO<1:M>, FCE<1:N>, and FCO<1:N> connected to each word line, and data reading and writing are simultaneously performed for even-numbered cell transistors NCE<1:M> and FCE<1:N> among the plurality of memory cell transistors NCE<1:M>, NCO<1:M>, FCE<1:N>, and FCO<1:N> connected to each word line. In the 1-bit configuration, each word line becomes two pages PAGE_EVEN and PAGE_ODD. Also, when each of the plurality of memory, cell transistors NCE<1:M>, NCO<1:M>, FCE<1:N>, and FCO<1:N> connected to each word line of the plurality of word lines WL<0:31> can store 2-bit data, data reading and writing are simultaneously performed for the odd-numbered cell transistors NCO<1:M> and FCO<1:N> among the plurality of memory cell transistors NCE<1:M>, NCO<1:M>, FCE<1:N>, and FCO<1:N> connected to each word line, and data reading and writing are simultaneously performed for the even-numbered cell transistors NCE<1:M> and FCE<1:N> among the plurality of memory cell transistors NCE<1:M>, NCO<1:M>, FCE<1:N>, and FCO<1:N> connected to each word line. In the 2-bit configuration, each word line becomes four pages PAGE_LSB_EVEN, PAGE_MSB_EVEN, PAGE_LSB_ODD, and PAGE_MSB_ODD.

In this way, the unit referred to as a page in a nonvolatile memory device means a minimum unit for which data reading and writing are simultaneously performed, and a plurality of pages may be accessed by each word line. Accordingly, although the nonvolatile memory device in accordance with the second embodiment of the present invention includes a plurality of word lines each including a plurality of pages, since all the word lines WL<0:31> have the same operational characteristics, operations of the nonvolatile memory device will be described below with respect to one representative word line WL<1>.

First, one word line WL<1> includes K number of pages PAGE<1:K>. Each of the K number of pages PAGE<1:K> includes a normal area NORMAL AREA in which M number of nonvolatile memory cells NCE<1:M> and NCO<1:M> are disposed and a flag area FLAG AREA in which N number of nonvolatile memory cells FCE<1:N> and FCO<1:N> are disposed. Here, M may be an integer equal to or greater than 2, N may also be an integer equal to or greater than 2, and K may be an integer equal to or greater than 1.

For reference, in the second embodiment of the present invention, although descriptions will be made on the assumption that K is 2, this is for illustration purposes, and the second embodiment of the present invention includes the case where K is greater than 2. Therefore, descriptions will be made on the assumption that one word line WL<1> includes an odd page PAGE_ODD and an even page PAGE_EVEN.

Normal data NR_DATA<1:M>, which is inputted to and outputted from the normal area NORMAL AREA of the odd page PAGE_ODD or the normal area NORMAL AREA of the even page PAGE_EVEN, may be changed in value by a user. More specifically, the data applied to the nonvolatile memory device by the user is the normal data NR_DATA<1:M> that is respectively stored in the normal area NORMAL AREA of the odd page PAGE_ODD or the normal area NORMAL AREA of the even page PAGE_EVEN, and the data outputted from the nonvolatile memory device according to the user's need is the normal data NR_DATA<1:M> that is respectively outputted from the normal area NORMAL AREA of the odd page PAGE_ODD or the normal area NORMAL AREA of the even page PAGE_EVEN.

Conversely, flag data FLG_DATA<1:N>, which is respectively inputted to and outputted from the flag area FLAG AREA of the odd page PAGE_ODD or the flag area FLAG AREA of the even page PAGE_EVEN, may be changed in value according to the current state of the odd page PAGE_ODD or the even page PAGE_EVEN. More specifically, in the flag area FLAG AREA of the even page PAGE_EVEN, the data input/output control unit 640 of the nonvolatile memory device determines the values of the flag data FLG_DATA<1:N> to be stored in the flag area FLAG AREA of the even page PAGE_EVEN in response to the current state of the normal area NORMAL AREA of the even page PAGE_EVEN, and in the flag area FLAG AREA of the odd page PAGE_ODD, the data input/output control unit 640 of the nonvolatile memory device determines the values of the flag data FLG_DATA<1:N> to be stored in the flag area FLAG AREA of the odd page PAGE_ODD in response to the current state of the normal area NORMAL AREA of the odd page PAGE_ODD. The user may not access the flag area FLAG AREA of the even page PAGE_EVEN or the flag area FLAG AREA of the odd page PAGE_ODD.

The flag data FLG_DATA<1:N> that indicates the current state of the normal area NORMAL AREA of the even page PAGE_EVEN, for example, is data that indicates to which stage an operation for writing the normal data NR_DATA<1:M> to the normal area NORMAL AREA of the even page PAGE_EVEN is performed. Accordingly, by reading the flag data FLG_DATA<1:N>, to which stage the operation for writing the normal data NR_DATA<1:M> to the normal area NORMAL AREA of the even page PAGE_EVEN is performed may be determined. By reading the flag data FLG_DATA<1:N> that indicates the current state of the normal area NORMAL AREA of the even page PAGE_EVEN, the verify reading voltage of the even page PAGE_EVEN may be controlled.

Similarly, the flag data FLG_DATA<1:N> that indicates the current state of the normal area NORMAL AREA of the odd page PAGE_ODD, for example, is data that indicates to which stage an operation for writing the normal data NR_DATA<1:M> to the normal area NORMAL AREA of the odd page PAGE_ODD is performed. Accordingly, by reading the flag data FLG_DATA<1:N>, to which stage the operation for writing the normal data NR_DATA<1:M> to the normal area NORMAL AREA of the odd page PAGE_ODD is performed may be determined. By reading the flag data FLG_DATA<1:N> that indicates the current state of the normal area NORMAL AREA of the odd page PAGE_ODD, the verify reading voltage of the odd page PAGE_ODD may be controlled.

For reference, while the normal area NORMAL AREA and the flag area FLAG AREA of the even page PAGE_EVEN and the odd page PAGE_ODD are shown as having the same size, this is for illustration purposes, and actually the normal area NORMAL AREA of the respective even page PAGE_EVEN and odd page PAGE_ODD is remarkably larger than the flag area FLAG AREA. As a result, the dimension and the number of nonvolatile memory cells of the normal area NORMAL AREA of the respective even page PAGE_EVEN and the odd page PAGE_ODD are significantly different from those of the flag area FLAG AREA. For example, when the number of the nonvolatile memory cells NCE<1:M> included in the normal area NORMAL AREA of the even page PAGE_EVEN is 8 Kbytes, the number of the nonvolatile memory cells FCE<1:N> included in the flag area FLAG AREA of the even page PAGE_EVEN is 4 Bytes. Similarly, when the number of the nonvolatile memory cells NCO<1:M> included in the normal area NORMAL AREA of the odd page PAGE_ODD is 8 Kbytes, the number of the nonvolatile memory cells FCO<1:N> included in, the flag area FLAG AREA of the odd page PAGE_ODD is 4 Bytes.

In order to write and read the normal data NR_DATA<1:M> to and from 2*M number of nonvolatile memory cells NCE<1:M> and NCO<1:M> included in the normal area NORMAL AREA of the even page PAGE_EVEN and the normal area NORMAL AREA of the odd page PAGE_ODD, M number of normal page buffers 600<1:M> are disposed.

Such M number of normal page buffers 600<1:M> may alternately select nonvolatile memory cells NCE<x> and NCO<x> respectively included in the normal area NORMAL AREA of the even page PAGE_EVEN and the odd page PAGE_ODD in such a manner that nonvolatile memory cells NCE<1> or NCO<1>, NCE<2> or NCO<2>, . . . and NCE<M> or NCO<M> are selected, and as a result, the M number of normal page buffers 600<1:M> may input and output the normal data NR_DATA<1:M> to and from the M number of nonvolatile memory cells NCE<1:M> or NCO<1:M>, which are respectively included in the normal area NORMAL AREA of the even page PAGE_EVEN and the odd page PAGE_ODD and are not adjacent to each other.

For example, the M number of nonvolatile memory cells NCE<1:M> included in the normal area NORMAL AREA of the even page PAGE_EVEN may be selected, and the normal data NR_DATA<1:M> may be inputted to and outputted from the M number of nonvolatile memory cells NCE<1:M>, and at this time, the M number of nonvolatile memory cells NCO<1:M> included in the normal area NORMAL AREA of the odd page PAGE_ODD are not selected and the normal data NR_DATA<1:M> is not inputted to and outputted from the M number of nonvolatile memory cells NCO<1:M>. Similarly, the M number of nonvolatile memory cells NCO<1:M> included in the normal area NORMAL AREA of the odd page PAGE_ODD may be selected, and the normal data NR_DATA<1:M> may be inputted to and outputted from the M number of nonvolatile memory cells NCO<1:M>, and at this time, the M number of nonvolatile memory cells NCE<1:M> included in the normal area NORMAL AREA of the even page PAGE_EVEN are not selected, and the normal data NR_DATA<1:M> is not inputted to and outputted from the NI number of nonvolatile memory cells NCE<1:M>.

The M number of normal page buffers 600<1:M> are controlled by the data input/output control unit 640.

In detail, when an operation for inputting/outputting the normal data NR_DATA<1:M> is performed, the data input/output control unit 640 selects (enables) all the M number of normal page buffers 600<1:M> such that all the M-bit normal data NR_DATA<1:M> may be simultaneously inputted/outputted.

Further, in order to write and read the flag data FLG_DATA<1:N> to and from the 2*N number of nonvolatile memory cells FCE<1:N> and FCO<1:N> included in the flag area FLAG AREA of the even page PAGE_EVEN and the flag area FLAG AREA of the odd page PAGE_ODD, the N number of flag page buffers 610<1:N>, are disposed.

The N number of flag page buffers 610<1:M> may alternately select nonvolatile memory cells FCE<x> and FCO<x> respectively included in the flag area FLAG AREA of the even page PAGE_EVEN and the odd page PAGE_ODD in such a manner that nonvolatile memory cells FCE<1> or FCO<1>, FCE<2> or FCO<2>, . . . and FCE<N> or FCO<N> are selected, and thereby, may input and output the flag data FLG_DATA<1:N> to and from the N number of nonvolatile memory cells FCE<1:N> or FCO<1:N>, which are respectively included in the flag area FLAG AREA of the even page PAGE_EVEN and the odd page PAGE_ODD and are not adjacent to each other.

For example, when adding the number of nonvolatile memory cells selected among the N number of nonvolatile memory cells FCE<1:N> included in the flag area FLAG AREA of the even page PAGE_EVEN and the number of nonvolatile memory cells selected among the N number of nonvolatile memory cells FCO<1:N> included in the flag area FLAG AREA of the odd page PAGE_ODD, the number of N is obtained. In this way, the flag data FLG_DATA<1:N> is inputted and outputted to and from the N number of selected nonvolatile memory cells that are selected from the flag area FLAG AREA of the even page PAGE_EVEN or the odd page PAGE_ODD. At this time, the flag data FLG_DATA<1:N> is not inputted and outputted to and from nonvolatile memory cells that are not selected from the flag area FLAG AREA of the even page PAGE_EVEN or the odd page PAGE_ODD.

Such N number of flag page buffers 610<1:N> are controlled by the data input/output control unit 640.

In detail, when an operation for inputting/outputting the flag data FLG_DATA<1:N> is performed, the data input/output control unit 640 selects (enables) R number of flag page buffers among the N number of flag page buffers 610<1:N> that are not adjacent to one another such that R-bit flag data is inputted/outputted, and does not select (disables) N−R number of flag page buffers such that flag data is not inputted/outputted.

For example, when the N number of nonvolatile memory cells FCE<1:N> included in the flag area FLAG AREA of the even page PAGE_EVEN or the N number of nonvolatile memory cells FCO<1:N> included in the flag area FLAG AREA of the odd page PAGE_ODD are selected and an operation for inputting/outputting the flag data FLG_DATA<1:N> is performed, the data input/output control unit 640 selects odd-numbered flag page buffers 610<1>, 610<3>, 610<5>, . . . and 610<N-1> among the N number of flag page buffers 610<1:N> such that N/2-bit flag data FLG_DATA<1>, FLG_DATA<3>, FLG_DATA<5>, . . . and FLG_DATA<N-1> is inputted and outputted to and from the odd-numbered nonvolatile memory cells FCE<1>, FCE<3>, FCE<5>, . . . and FCE<N-1> among the N number of nonvolatile memory cells FCE<1:N> included in the flag area FLAG AREA of the even page PAGE_EVEN and the odd-numbered nonvolatile memory cells FCO<1>, FCO<3>, FCO<5>, . . . and FCO<N-1> among the N number of nonvolatile memory cells FCO<1:N> included in the flag area FLAG AREA of the odd page PAGE_ODD. In addition, flag data is not inputted and outputted to and from the unselected even-numbered flag page buffers 610<2>, 610<4>, 610<6>, . . . and 610<N>.

Similarly, when the N number of nonvolatile memory cells FCE<1:N> included in the flag area FLAG AREA of the even page PAGE_EVEN or the N number of nonvolatile memory cells FCO<1:N> included in the flag area FLAG AREA of the odd page PAGE_ODD are selected and an operation for inputting/outputting the flag data FLG_DATA<1:N> is performed, the data input/output control unit 640 selects even-numbered flag page buffers 610<2>, 610<4>, 610<6>, . . . and 610<N> among the N number of flag page buffers 610<1:N> such that N/2-bit flag data FLG_DATA<2>, FLG_DATA<4>, FLG_DATA<5>, . . . and FLG_DATA<N> is inputted and outputted to and from the even-numbered nonvolatile memory cells FCE<2>, FCE<4>, FCE<5>, . . . and FCE<N> among the N number of nonvolatile memory cells FCE<1:N> included in the flag area FLAG AREA of the even page PAGE_EVEN and the even-numbered nonvolatile memory cells FCO<2>, FCO<4>, FCO<6>, . . . and FCO<N> among the N number of nonvolatile memory cells FCO<1:N> included in the flag area FLAG AREA of the odd page PAGE_ODD. In addition, flag data is not inputted and outputted to and from the unselected odd-numbered flag page buffers 610<1>, 610<3>, 610<4>, . . . and 610<N-1>.

In order to operate the data input/output control unit 640 operates as described above, a method of controlling the values of cell select control signals CS_CNTLE<M+1:M+N> and CS_CNTLO<M+1:M+N> capable of respectively selecting the N number of nonvolatile memory cells FCE<1:N> included in the flag area FLAG AREA of the even page PAGE_EVEN and the N number of nonvolatile memory cells FCO<1:N> included in the flag area FLAG AREA of the odd page PAGE_ODD may be used. More specifically, by controlling the values of the cell select control signals CS_CNTLE<M+1:M+N> and CS_CNTLO<M+1:M+N> capable of respectively selecting the N number of nonvolatile memory cells FCE<1:N> included in the flag area FLAG AREA of the even page PAGE_EVEN and the N number of nonvolatile memory cells FCO<1:N> included in the flag area FLAG AREA of the odd page PAGE_ODD, the odd-numbered flag page buffers 610<1>, 610<3>, 610<5>, . . . and 610<N-1> among the N number of flag page buffers 610<1:N> may input/output the N/2-bit flag data FLG_DATA<1>, FLG_DATA<3>, FLG_DATA<5>, . . . and FLG_DATA<N−1>, or the even-numbered flag page buffers 610<2>, 610<4>, 610<6>, . . . and 610<N> among the N number of flag page buffers 610<1:N> may input/output the N/2-bit flag data FLG_DATA<2>, FLG_DATA<4>, FLG_DATA<6>, . . . and FLG_DATA<N>.

For example, as shown in FIG. 8B, if even-numbered cell select control signals CS_CNTLE<1:8> with values of '1 1 0 1 1 1 0 1' are applied and odd-numbered cell select control signals CS_CNTLO<1:8> with values of '01 1 1 0 1 1 1' are applied, third and seventh nonvolatile memory cells FCE<3> and FCE<7> are selected among eight nonvolatile memory cells FCE<1:8> included in the flag area FLAG AREA of the even page PAGE_EVEN, and the 2-bit flag data FLG_DATA<3> and FLG_DATA<7> are inputted and outputted through the third and seventh flag page buffers 610<3> and 610<7> corresponding to the third and seventh nonvolatile memory cells FCE<3> and FCE<7>, and first and fifth nonvolatile memory cells FCO<1> and FCO<5> are selected among eight nonvolatile memory cells FCO<1:8> included in the flag area FLAG AREA of the odd page PAGE_ODD, and the 2-bit flag data FLG_DATA<1> and FLG_DATA<5> are inputted and outputted through the first and fifth flag page buffers 610<1> and 610<5> corresponding to the first and fifth nonvolatile memory cells FCO<1> and FCO<5>.

More specifically, in correspondence to the third and seventh nonvolatile memory cells FCE<3> and FCE<7> of the even page PAGE_EVEN and the first and fifth nonvolatile memory cells FCO<1> and FCO<5> of the odd page PAGE_ODD among the nonvolatile memory cells FCE<1:8> and FCO<1:8> included in the flag area FLAG AREA of the even page PAGE_EVEN and the odd page PAGE_ODD, the 4-bit flag data FLG_DATA<1>, FLG_DATA<3>, FLG_DATA<5>, and FLG_DATA<7> is inputted and outputted through the odd-numbered flag page buffers 610<1>, 610<3>, 610<5>, and 610<7> among the eight flag page buffers 610<1:8>.

At this time, no flag data is inputted and outputted through the even-numbered flag page buffers 610<2>, 610<4>, 610<6>, 610<8> among the eight flag page buffers 610<1:8> corresponding to the flag area FLAG AREA of the even page PAGE_EVEN and the odd page PAGE_ODD.

Accordingly, among the eight nonvolatile memory cells FCE<1:8> and FCO<1:8> included respectively in the flag area FLAG AREA of the even page PAGE_EVEN and the odd page PAGE_ODD, the cells FCE<1>, FCO<2>, FCE<2>, FCO<3>, FCO<4>, FCE<4>, FCE<5>, FCO<6>, FCE<6>, FCO<7>, FCO<8>, and FCE<8> in which no data is stored exist between the cells FCO<1>, FCE<3>, FCO<5> and FCE<7> in which the 4-bit flag data FLG_DATA<1>, FLG_DATA<3>, FLG_DATA<5>, and FLG_DATA<7> is stored. In this configuration, the occurrence of an interference phenomenon between adjacent cells may be minimized while the 4-bit flag data FLG_DATA<1>, FLG_DATA<3>, FLG_DATA<5> and FLG_DATA<7> is stored.

Similarly, while not shown in a drawing, if even-numbered cell select control signals CS_CNTLE<1:8> with values of '1 1 1 0 1 1 1 0' are applied and odd-numbered cell select control signals CS_CNTLO<1:8> with values of '1 0 1 1 1 0 1 1' are applied, fourth and eighth nonvolatile memory cells FCE<4> and FCE<8> are selected among eight nonvolatile memory cells FCE<1:8> included in the flag area FLAG AREA of the even page PAGE_EVEN and the 2-bit flag data FLG_DATA<4> and FLG_DATA<8> is inputted and outputted through the fourth and eighth flag page buffers 610<4> and 610<8> corresponding to the fourth and eighth nonvolatile memory cells FCE<4> and FCE<8>, and second and sixth nonvolatile memory cells FCO<2> and FCO<6> are selected among eight nonvolatile memory cells FCO<1:8> included in the flag area FLAG AREA of the odd page PAGE_ODD and the 2-bit flag data FLG_DATA<2> and FLG_DATA<6> is inputted and outputted through the second and sixth flag page buffers 610<2> and 610<6> corresponding to the second and sixth nonvolatile memory cells FCO<2> and FCO<6>.

More specifically, in correspondence to the fourth and eighth nonvolatile memory cells FCE<4> and FCE<8> of the even page PAGE_EVEN and the second and sixth nonvolatile memory cells FCO<2> and FCO<6> of the odd page PAGE_ODD among the nonvolatile memory cells FCE<1:8> and FCO<1:8> included by the number of 8 in the flag area FLAG AREA of the even page PAGE_EVEN and the odd page PAGE_ODD, the 4-bit flag data FLG_DATA<2>, FLG_DATA<4>, FLG_DATA<6>, and FLG_DATA<8> is inputted and outputted through the even-numbered flag page buffers 610<2>, 610<4>, 610<6>, and 610<8> among the eight flag page buffers 610<1:8>.

At this time, no flag data is inputted and outputted through the odd-numbered flag page buffers 610<1>, 610<3>, 610<5>, 610<7> among the eight flag page buffers 610<1:8> corresponding to the flag area FLAG AREA of the even page PAGE_EVEN and the odd page PAGE_ODD.

Accordingly, among the eight nonvolatile memory cells FCE<1:8> and FCO<1:8> included respectively in the flag area FLAG AREA of the even page PAGE_EVEN and the odd page PAGE_ODD, the cells FCO<1>, FCE<1>, FCE<2>, FCO<3>, FCE<3>, FCO<4>, FCO<5>, FCE<5>, FCE<6>, FCO<7>, FCE<7>, and FCO<8> in which no data is stored exist between the cells FCO<2>, FCE<4>, FCO<6>, and FCE<8> in which the 4-bit flag data FLG_DATA<2>, FLG_DATA<4>, FLG_DATA<6>, and FLG_DATA<8> is stored. In this configuration, the occurrence of an interference phenomenon between adjacent cells is minimized while the 4-bit flag data FLG_DATA<2>, FLG_DATA<4>, FLG_DATA<6>, and FLG_DATA<8> are stored.

Figure 9B:
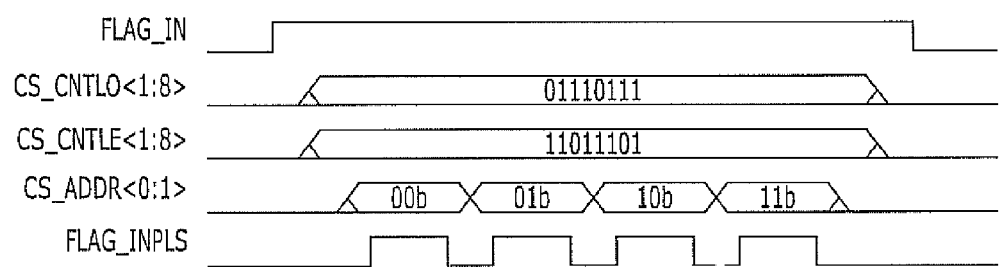

In this way, when the number of nonvolatile memory cells included in the flag area FLAG AREA of the even page PAGE_EVEN is increased to 32 as FCE<1:32> and the number of nonvolatile memory cells included in the flag area FLAG AREA of the odd page PAGE_ODD is increased to 32 as FCO<1:32>, as shown in FIG. 9B, through a method of counting cell select addresses CS_ADDR<0:1> in the sequence of 00b, 01b, 10b and 11b with the values of the cell select control signals CS_CNTLE<1:8> and CS_CNTLO<1:8> controlled, odd-numbered flag page buffers 610<1>, 610<3>, 610<5>, . . . and 610<31> among thirty-two flag page buffers 610<1:32> included in the flag area FLAG AREA of the even page PAGE_EVEN and the odd page PAGE_ODD may input/output 16-bit flag data FLG_DATA<1>, FLG_DATA<3>, FLG_DATA<5>, . . . and FLG_DATA<31>, or even-numbered flag page buffers 610<2>, 610<4>, 610<6>, . . . and 610<32> among the thirty-two flag page buffers 610<1:32> included in the flag area FLAG AREA of the even page PAGE_EVEN and the odd page PAGE_ODD may input/output 16-bit flag data FLG_DATA<2>, FLG_DATA<4>, FLG_DATA<6>, . . . and FLG_DATA<32>.

The normal data NR_DATA<1:M> may be stored by multiple bits in the 2*M number of nonvolatile memory cells NCE<1:M> and NCO<1:M> included in the normal area NORMAL AREA of the even page PAGE_EVEN and the odd page PAGE_ODD, and the flag data FLG_DATA<1:N> may be stored each by two bits in the 2*N number of nonvolatile memory cells FCE<1:N> and FCO<1:N> included in the flag area FLAG AREA of the even page PAGE_EVEN and the odd page PAGE_ODD. More specifically, in the normal data NR_DATA<1:M>, since an amount of data to be stored is an important goal, a configuration capable of storing more data may be used, and in the flag data FLG_DATA<1:N>, since accuracy of data to be read is an important goal, a configuration with less probability of an error occurring may be used.

FIG. 10A illustrates an example of a threshold voltage distribution of the 2*M number of nonvolatile memory cells NCE<1:M> and NCO<1:M> included in the normal area NORMAL AREA, and FIG. 10B illustrates an example of a threshold voltage distribution of the 2*N number of nonvolatile memory cells FCE<1:N> and FCO<1:N> included in the flag area FLAG AREA.

Referring to FIG. 10B, the initial state of the 2*N number of nonvolatile memory cells FCE<1:N> and FCO<1:N> included in the flag area FLAG AREA of the even page PAGE_EVEN and the odd page PAGE_ODD corresponds, for example, to a case in which the flag data FLG_DATA<1:N> becomes "1" (=an erased state). This state represents, for example, a state in which writing of the normal data NR_DATA<1:M> to be stored in the normal area NORMAL AREA of the even page PAGE_EVEN and the odd page PAGE_ODD is not completed. In this way, by reading the flag data FLG_DATA<1:N> from the 2*N number of nonvolatile memory cells FCE<1:N> and FCO<1:N> included in the flag area FLAG AREA of the even page PAGE_EVEN and the odd page PAGE_ODD, if the values of the flag data FLG_DATA<1:N> are "1", the writing of the normal data NR_DATA<1:M> to be stored in the normal area NORMAL AREA of the even page PAGE_EVEN and the odd page PAGE_ODD is not completed.

Thereafter, if the writing of the normal data NR_DATA<1:M> to be stored in the normal area NORMAL AREA of the even page PAGE_EVEN and the odd page PAGE_ODD is completed, electrons are introduced into the floating gates of cells (odd-numbered or even-numbered cells) selected among the 2*N number of nonvolatile memory cells FCE<1:N> and FCO<1:N> included in the flag area FLAG AREA of the even page PAGE_EVEN and the odd page PAGE_ODD, and the threshold values of the flag cells are raised from the erased state of "1" to a written state of "0". By reading the flag data FLG_DATA<1, 3, 5, . . . , N−1> or FLG_DATA<2, 4, 6, . . . , N> from the cells selected among the 2*N number of nonvolatile memory cells FCE<1:N> and FCO<1:N> included in the flag area FLAG AREA of the even page PAGE_EVEN and the odd page PAGE_ODD, whether the writing of the normal data NR_DATA<1:M> to be stored in the normal area NORMAL AREA is completed may be determined.

In addition, when the values of the flag data FLG_DATA<1, 3, 5, . . . , N−1> or FLG_DATA<2, 4, 6, . . . N> read from the cells selected among the 2*N number of nonvolatile memory cells FCE<1:N> and FCO<1:N> included in the flag area FLAG AREA of the even page PAGE_EVEN and the odd page PAGE_ODD are "0", the values of the flag data FLG_DATA<2, 4, 6, . . . N> or FLG_DATA<1, 3, 5, . . . , N-1> read from the unselected cells may be maintained as "1".

However, if the values of the flag data FLG_DATA<2, 4, 6, . . . , N> or FLG_DATA<1, 3, 5, . . . , N−1> read from the unselected cells become "0", an interference phenomenon has occurred in the unselected cells.

In this way, if the interference phenomenon is known by reading the values of the flag data FLG_DATA<2, 4, 6, . . . , N> or FLG_DATA<1, 3, 5, . . . , N−1> from the unselected cells, the interference phenomenon may be offset through a method of controlling the level of a read reference voltage Vread while reading the flag data FLG_DATA<1, 3, 5, . . . , N−1> or FLG_DATA<2, 4, 6, . . . , N> of the selected cells.

Third Embodiment

Figure 7:
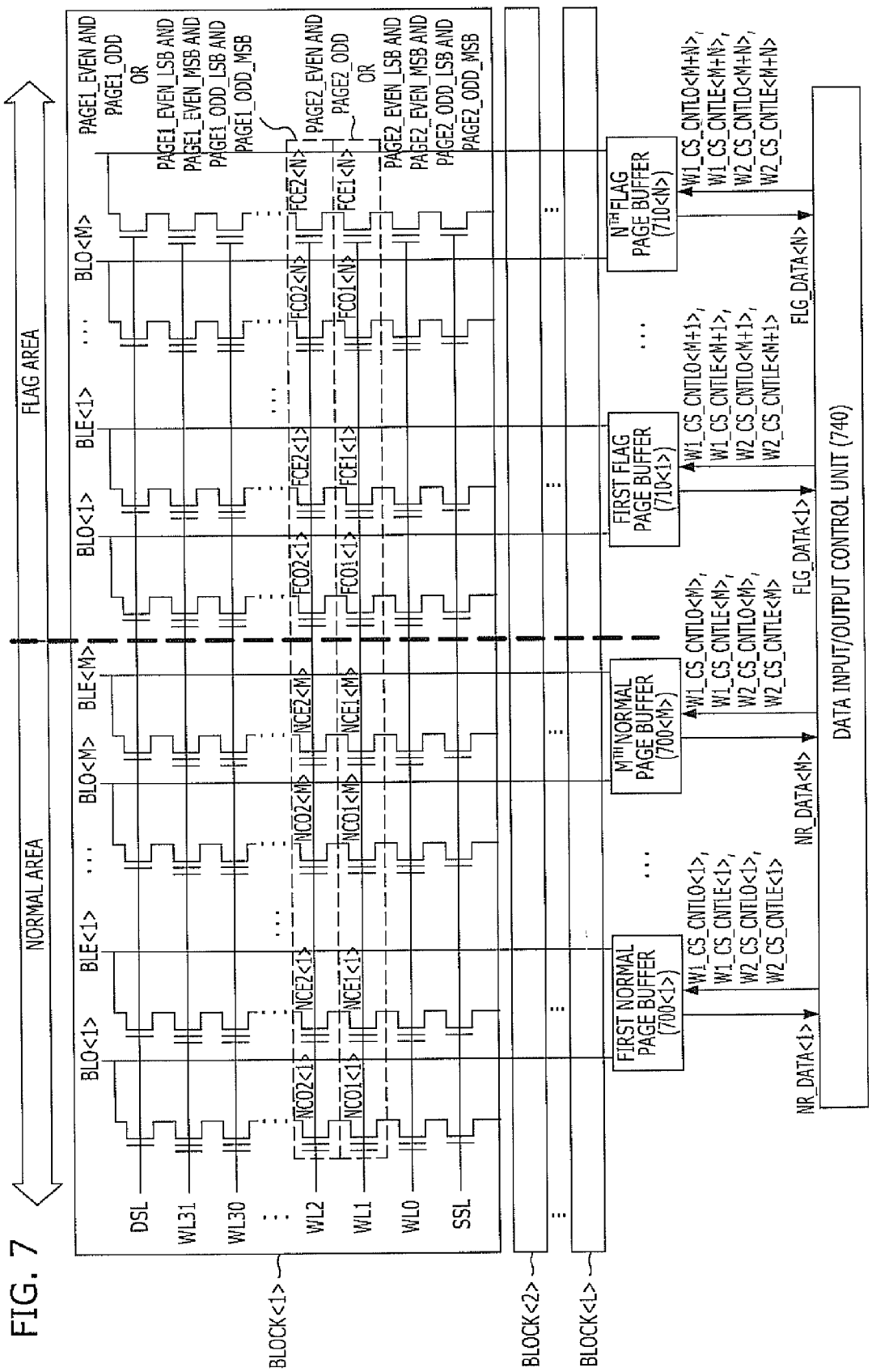
FIG. 7 is a block diagram illustrating the configuration of a nonvolatile memory device in accordance with a third embodiment of the present invention.

FIG. 7 is a block diagram illustrating the configuration of a nonvolatile memory device in accordance with a third embodiment of the present invention.

Referring to FIG. 7, a nonvolatile memory device in accordance with a third embodiment of the present invention includes a first word line WL<1>, a second word line WL<2>, M number of normal page buffers 700<1:M>, N number of flag page buffers 710<1:N>, and a data input/output control unit 640. The word line WL<1> includes K number of pages PAGE<1:K>.

For reference, a plurality of blocks BLOCK<1:L> are included in a memory cell array of the nonvolatile memory device. A plurality of word lines WL<0:31> and a plurality of bit lines BL_EVEN<1:M>, BL_ODD<1:M>, BL_EVEN<M+1:M+N>, BL_ODD<M+1:M+N> are arranged in an array type in each of the plurality of blocks BLOCK<1:L>, and nonvolatile memory cell transistors are disposed at respective crossing points. When each of a plurality of memory cell transistors NCE<1:M>, NCO<1:M>, FCE<1:N>, and FCO<1:N> connected to each word line of the plurality of word lines WL<0:31> can store 1-bit data, data reading and writing are simultaneously performed for odd-numbered cell transistors NCO<1:M> and FCO<1:N> among the plurality of memory cell transistors NCE<1:M>, NCO<1:M>, FCE<1:N>, and FCO<1:N> connected to each word line, and data reading and writing are simultaneously performed for even-numbered cell transistors NCE<1:M> and FCE<1:N> among the plurality of memory cell transistors NCE<1:M>, NCO<1:M>, FCE<1:N>, and FCO<1:N> connected to each word line. In the 1-bit configuration, each word line becomes two pages PAGE1_EVEN and PAGE1_ODD. Of course, two adjacent word lines WL<1> and WL<2> may become four pages PAGE1_EVEN, PAGE1_ODD, PAGE2_EVEN and PAGE2_ODD.

Also, when each of the plurality of memory cell transistors NCE<1:M>, NCO<1:M>, FCE<1:N>, and FCO<1:N> connected to each word line of the plurality of word lines WL<0:31> can store 2-bit data, data reading and writing are simultaneduusly performed for the odd-numbered cell transistors NCO<1:M> and FCO<1:N> among the plurality of memory cell transistors NCE<1:M>, NCO<1:M>, FCE<1:N>, and FCO<1:N> connected to each word line, and data reading and writing are simultaneously performed for the even-numbered cell transistors NCE<1:M> and FCE<1:N> among the plurality of memory cell transistors NCE<1:M>, NCO<1:M>, FCE<1:N>, and FCO<1:N> connected to each word line. In the 2-bit configuration, each word line becomes four pages PAGE1_EVEN_LSB, PAGE1_EVEN_MSB, PAGE1_ODD_LSB, and PAGE1_ODD_MSB. Of course, two adjacent word lines WL<1> and WL<2> may become eight pages PAGE1_EVEN_LSB, PAGE1_EVEN_MSB, PAGE1_ODD_LSB, PAGE1_ODD_MSB, PAGE2_EVEN_LSB, PAGE2_EVEN_MSB, PAGE2_ODD_LSB, and PAGE2_ODD_MSB.

In this way, the unit referred to as a page in a nonvolatile memory device means a minimum unit for which data reading and writing are simultaneously performed, and a plurality of pages may be included in each word line. Accordingly, although the nonvolatile memory device in accordance with the third embodiment of the present invention includes a plurality of word lines each including a plurality of pages, when, among the plurality of word lines WL<0:31> included in the nonvolatile memory device exemplified in the third embodiment of the present invention, even-numbered word lines WL<0>, WL<2>, WL<4>, . . . and WL<30> and odd-numbered word lines WL<1>, WL<3>, WL<5>, . . . and WL<31> are divided by the unit of two adjacent word lines WL<0> and WL<1>, WL<1> and WL<2>, WL<2> and WL<3>, WL<3> and WL<4>, . . . and WL<30> and WL<31>, and respective pairs have the same operational characteristics. Therefore, operations of the nonvolatile memory device in accordance with the third embodiment of the present invention will be described below with respect to two word lines WL<1> and WL<2>.

First, the first word line WL<1> includes K number of pages PAGE1<1:K>. Each of the K number of pages PAGE1<1:K> includes a normal area NORMAL AREA in which M number of nonvolatile memory cells NCE1<1:M> and NCO1<1:M> are disposed and a flag area FLAG AREA in which N number of nonvolatile memory cells FCE1<1:N> and FCO1<1:N> are disposed.

Further, the second word line WL<2> includes K number of pages PAGE2<1:K>. Each of the K number of pages PAGE2<1:K> includes a normal area NORMAL AREA in which M number of nonvolatile memory cells NCE2<1:M> and NCO2<1:M> are disposed and a flag area FLAG AREA in which N number of nonvolatile memory cells FCE2<1:N> and FCO2<1:N> are disposed. Here, M may be an integer equal to or greater than 2, N may also be an integer equal to or greater than 2, and K may be an integer equal to or greater than 1.

For reference, in the third embodiment of the present invention, although descriptions will be made on the assumption that K is 2, this is for illustration purposes, and the third embodiment of the present invention includes the case where K is greater than 2. Therefore, descriptions will be made on the assumption that the first word line WL<1> includes an odd page PAGE1_ODD and an even page PAGE1_EVEN, and the second word line WL<2> includes an odd page PAGE2_ODD and an even page PAGE2_EVEN.

Normal data NR_DATA<1:M>, which is inputted to and outputted from the normal area NORMAL AREA of the odd page PAGE1_ODD or PAGE2_ODD or the even page PAGE1_EVEN or PAGE2_EVEN included in the first word line WL<1> or the second word line WL<2>, may be changed in value in response to a user. More specifically, the data applied to the nonvolatile memory device by the user is the normal data NR_DATA<1:M> that is respectively stored in the normal area NORMAL AREA of the odd page PAGE1_ODD or PAGE2_ODD or the even page PAGE1_EVEN or PAGE2_EVEN included in the first word line WL<1> or the second word line WL<2>, and the data outputted from the nonvolatile memory device according to the user's need is the normal data NR_DATA<1:M> that is respectively outputted from the normal area NORMAL AREA of the odd page PAGE1_ODD or PAGE2_ODD or the even page PAGE1_EVEN or PAGE2_EVEN included in the first word line WL<1> or the second word line WL<2>.

Conversely, flag data FLG_DATA<1:N>, which is respectively inputted to and outputted from the flag area FLAG AREA of the odd page PAGE1_ODD or PAGE2_ODD or the even page PAGE1_EVEN or PAGE2_EVEN included in the first word line WL<1> or the second word line WL<2>, may be changed in value in response to the current state of the odd page PAGE1_ODD or PAGE2_ODD or the even page PAGE1_EVEN or PAGE2_EVEN included in the first word line WL<1> or the second word line WL<2>.

More specifically, in the flag area FLAG AREA of the odd page PAGE1_ODD or PAGE2_ODD or the even page PAGE1_EVEN or PAGE2_EVEN included in the first word line WL<1> or the second word line WL<2>, the data input/output control unit 740 of the nonvolatile memory device determines the values of the flag data FLG_DATA<1:N> to be stored in the flag area FLAG AREA of the odd page PAGE1_ODD or PAGE2_ODD or the even page PAGE1_EVEN or PAGE2_EVEN included in the first word line WL<1> or the second word line WL<2> in response to the current state of the normal area NORMAL AREA of the odd page PAGE1_ODD or PAGE2_ODD or the even page PAGE1_EVEN or PAGE2_EVEN included in the first word line WL<1> or the second word line WL<2>. The user may not access the flag area FLAG AREA of the odd page PAGE1_ODD or PAGE2_ODD or the even page PAGE1_EVEN or PAGE2_EVEN included in the first word line WL<1> or the second word line WL<2>.

The flag data FLG_DATA<1:N> is data that indicates to which stage an operation for writing the normal data NR_DATA<1:M> to the normal area NORMAL AREA of the odd page PAGE1_ODD or PAGE2_ODD or the even page PAGE1_EVEN or PAGE2_EVEN inclUded in the first word line WL<1> or the second word line WL<2> is performed. Accordingly, by reading the flag data FLG_DATA<1:N>, to which stage the operation for writing the normal data NR_DATA<1:M> to the normal area NORMAL AREA of the odd page PAGE1_ODD or PAGE2_ODD or the even page PAGE1_EVEN or PAGE2_EVEN included in the first word line WL<1> or the second word line WL<2> is performed may be determined. By reading the flag data FLG_DATA<1:N>, the verify reading voltage of the odd page PAGE1_ODD or PAGE2_ODD or the even page PAGE1_EVEN or PAGE2_EVEN included in the first word line WL<1> or the second word line WL<2> may be controlled.

For reference, while the normal area NORMAL AREA and the flag area FLAG AREA of the odd page PAGE1_ODD or PAGE2_ODD or the even page PAGE1_EVEN or PAGE2_EVEN included in the first word line WL<1> or the second word line WL<2> are shown as having the same size, this is for illustration purposes and actually the normal area NORMAL AREA is remarkably larger than the flag area FLAG AREA. As a result, the dimension and the number of nonvolatile memory cells of the normal area NORMAL AREA are significantly different from those of the flag area FLAG AREA. For example, when the number of the nonvolatile memory cells NCE1<1:M>, NCE2<1:M>, NCO1<1:M>, or NCO2<1:M> included in the normal area NORMAL AREA of the odd page PAGE1_ODD or PAGE2_ODD or the even page PAGE1_EVEN or PAGE2_EVEN included in the first word line WL<1> or the second word line WL<2> is 8 Kbytes, the number of the nonvolatile memory cells FCE1<1:N>, FCE2<1:N>, FCO1<1:N>, or FCO2<1:N> included in the flag area FLAG AREA of the odd page PAGE1_ODD or PAGE2_ODD or the even page PAGE1_EVEN or PAGE2_EVEN included in the first word line WL<1> or the second word line WL<2> is 4 Bytes.

In order to write and read the normal data NR_DATA<1:M> to and from 2*M number of nonvolatile memory cells NCE1<1:M> and NCO1<1:M> or NCE2<1:M> and NCO2<1:M> included in the normal area NORMAL AREA of the odd page PAGE1_ODD or PAGE2_ODD or the even page PAGE1_EVEN or PAGE2_EVEN included in the first word line WL<1> or the second word line WL<2>, M number of normal page buffers 700<1:M> are disposed.

Such M number of normal page buffers 700<1:M> may alternately select nonvolatile memory cells NCE1<x> and NCO1<x> respectively included in the normal area NORMAL AREA of the even page PAGE1_EVEN and the odd page PAGE1_ODD included in the first word line WL<1> in such a manner that nonvolatile memory cells NCE1<1> or NCO1<1>, NCE1<2> or NCO1<2>, . . . and NCE1<M> or NCO1<M> are selected, and as a result, the M number of normal page buffers 700<1:M> may input and output the normal data NR_DATA<1:M> to and from the M number of nonvolatile memory cells NCE1<1:M> or NCO1<1:M>, which are respectively included in the normal area NORMAL AREA of the even page PAGE1_EVEN and the odd page PAGE1_ODD of the first word line WL<1> and are not adjacent to each other.

Similarly, such M number of normal page buffers 700<1: M> may alternately select nonvolatile memory cells NCE2<x> and NCO2<x> respectively included in the normal area NORMAL AREA of the even page PAGE2_EVEN and the odd page PAGE2_ODD included in the second word line WL<2> in such a manner that nonvolatile memory cells NCE2<1> or NCO2<1>, NCE2<2> or NCO2<2>, . . . and NCE2<M> or NCOZ<M> are selected, and as a result, the M number of normal page buffers 700<1:M> may input and output the normal data NR_DATA<1:M> to and from the M number of nonvolatile memory cells NCE2<1:M> or NCO2<1:M> which are respectively included in the normal area NORMAL AREA of the even page PAGE2_EVEN and the odd page PAGE2_ODD of the second word line WL<2> and are not adjacent to each other.

For example, the M number of nonvolatile memory cells NCE1<1:M> included in the normal area NORMAL AREA of the even page PAGE1_EVEN included in the first word line WL<1> may be selected and the normal data NR_DATA<1: M> may be inputted to and outputted from the M number of nonvolatile memory cells NCE1<1:M>, and at this time, the M number of nonvolatile memory cells NCO1<1:M> included in the normal area NORMAL AREA of the odd page PAGE1_ODD included in the first word line WL<1> are not selected, and the normal data NR_DATA<1:M> is not inputted to and outputted from the M number of nonvolatile memory cells NCO1<1:M>. Similarly, the M number of nonvolatile memory cells NCO1<1:M> included in the normal area NORMAL AREA of the odd page PAGE1_ODD included in the first word line WL<1> may be selected and the normal data NR_DATA<1:M> may be inputted to and outputted from the M number of nonvolatile memory cells NCO1<1:M>, and at this time, the M number of nonvolatile memory cells NCE1<1:M> included in the normal area NORMAL AREA of the even page PAGE1_EVEN included in the first word line WL<1> are not selected, and the normal data NR_DATA<1:M> is not inputted to and outputted from the M number of nonvolatile memory cells NCE1<1:M>.

Further, the M number of nonvolatile memory cells NCE2<1:M> included in the normal area NORMAL AREA of the even page PAGE2_EVEN included in the second word line WL<2> may be selected, and the normal data NR_DATA<1:M> may be inputted to and outputted from the M number of nonvolatile memory cells NCE2<1:M>, and at this time, the M number of nonvolatile memory cells NCO2<1:M> included in the normal area NORMAL AREA of the odd page PAGE2_ODD included in the second word line WL<2> are not selected, and the normal data NR_DATA<1:M> is not inputted to and outputted from the M number of nonvolatile memory cells NCO2<1:M>. Similarly, the M number of nonvolatile memory cells NCO2<1:M> included in the normal area NORMAL AREA of the odd page PAGE2_ODD included in the second word line WL<2> may be selected, and the normal data NR_DATA<1:M> may be inputted to and outputted from the M number of nonvolatile memory cells NCO2<1:M>, and at this time, the M number of nonvolatile memory cells NCE2<1:M> included in the normal area NORMAL AREA of the even page PAGE2_EVEN included in the second word line WL<2> are not selected, and the normal data NR_DATA<1:M> is not inputted to and outputted from the M number of nonvolatile memory cells NCE2<1:M>.

The M number of normal page buffers 700<1:M> are controlled by the data input/output control unit 740.

In detail, when an operation for inputting/outputting the normal data NR_DATA<1:M> is performed, the data input/output control unit 740 selects (enables) all the M number of normal page buffers 700<1:M> such that all the M-bit normal data NR_DATA<1:M> may be simultaneously inputted/outputted.

More specifically, in correspondence to the normal area NORMAL AREA of the even page PAGE1_EVEN and the odd page PAGE1_ODD included in the first word line WL<1>, all the M number of normal page buffers 700<1:M> are selected such that the M-bit normal data NR_DATA<1: M> may be simultaneously inputted/outputted.

Similarly, in correspondence to the normal area NORMAL AREA of the even page PAGE2_EVEN and the odd page PAGE2_ODD included in the second word line WL<2>, all the M number of normal page buffers 700<1:M> are selected such that the M-bit normal data NR_DATA<1:M> may be simultaneously inputted/outputted.

Further, in order to write and read the flag data FLG_DATA<1:N> to and from the 2*N number of nonvolatile memory cells FCE1<1:N> and FCO1<1:N> or FCE2<1:N> and FCO2<1:N> included in the flag area FLAG AREA of the even page PAGE1_EVEN or PAGE2_EVEN and the odd page PAGE1_ODD or PAGE2_ODD included in the first word line WL<1> or the second word line WL<2>, the N number of flag page buffers 710<1:N> are disposed.

The N number of flag page buffers 710<1:M> may alternately select nonvolatile memory cells FCE1<x> and FCO1<x> respectively included in the flag area FLAG AREA of the even page PAGE1_EVEN and the odd page PAGE1_ODD included in the first word line WL<1> in such a manner that nonvolatile memory cells FCE1<1> or FCO1<1>, FCE1<2> or FCO1<2>, . . . and FCE1<N> or FCO1<N> are selected, and thereby, may input and output the flag data FLG_DATA<1:N> to and from the N number of nonvolatile memory cells FCE1<1:N> or FCO1<1:N>, which are respectively included in the flag area FLAG AREA of the even page PAGE1_EVEN and the odd page PAGE1_ODD of the first word line WL<1> and are not adjacent to each other.

Similarly, the N number of flag page buffers 710<1:M> may alternately select nonvolatile memory cells FCE2<x> and FCO2<x> respectively included in the flag area FLAG AREA of the even page PAGE2_EVEN and the odd page PAGE2_ODD included in the second word line WL<2> in such a manner that nonvolatile memory cells FCE2<1> or FCO2<1>, FCE2<2> or FCO2<2>, . . . and FCE2<N> or FCO2<N> are selected, and thereby, may input and output the flag data FLG_DATA<1:N> to and from the N number of nonvolatile memory cells FCE2<1:N> or FCO2<1:N>, which are respectively included in the flag area FLAG AREA of the even page PAGE2_EVEN and the odd page PAGE2_ODD of the second word line WL<2> and are not adjacent to each other.

For example, when adding the number of nonvolatile memory cells selected among the N number of nonvolatile memory cells FCE1<1:N> included in the flag area FLAG AREA of the even page PAGE1_EVEN included in the first word line WL<1> and the number of nonvolatile memory cells selected among the N number of nonvolatile memory cells FCO1<1:N> included in the flag area FLAG AREA of the odd page PAGE1_ODD, the number of N is obtained. In this way, the flag data FLG_DATA<1:N> is inputted and outputted to and from the N number of selected nonvolatile memory cells that are selected from the flag area FLAG AREA of the even page PAGE1_EVEN or the odd page PAGE1_ODD. At this time, the flag data FLG_DATA<1:N> is not inputted and outputted to and from nonvolatile memory cells that are not selected from the flag area FLAG AREA of the even page PAGE1_EVEN or the odd page PAGE1_ODD included in the first word line WL<1>.

Similarly, when adding the number of nonvolatile memory cells selected among the N number of nonvolatile memory cells FCE2<1:N> included in the flag area FLAG AREA of the even page PAGE2_EVEN included in the second word line WL<2> and the number of nonvolatile memory cells selected among the N number of nonvolatile memory cells FCO2<1:N> included in the flag area FLAG AREA of the odd page PAGE2_ODD, the number of N is obtained. In this way, the flag data FLG_DATA<1:N> is inputted and outputted to and from the N number of selected nonvolatile memory cells that are selected from the flag area FLAG AREA of the even page PAGE2_EVEN or the odd page PAGE2_ODD. At this time, the flag data FLG_DATA<1:N> is not inputted and outputted to and from nonvolatile memory cells that are not selected from the flag area FLAG AREA of the even page PAGE2_EVEN or the odd page PAGE2_ODD included in the second word line WL<2>.

Such N number of flag page buffers 710<1:N> are controlled by the data input/output control unit 740.

In detail, when an operation for inputting/outputting the flag data FLG_DATA<1:N> is performed, the data input/output control unit 740 selects a first group of flag page buffers among the N number of flag page buffers 710<1:N> that are not adjacent to one another in correspondence to the flag area FLAG AREA of the even page PAGE1_EVEN and the odd page PAGE1_ODD included in the first word line WL<1>, and the data input/output control unit 740 does not select flag page buffers among the N number of flag page buffers 710<1:N> that are not included in the first group.

Conversely, the data input/output control unit 740 selects only a second group of flag page buffers among the N number of flag page buffers 710<1:N> that are not adjacent to one another and do not overlap with the first group of flag page buffers in correspondence to the flag area FLAG AREA of the even page PAGE2_EVEN and the odd page PAGE2_ODD included in the second word line WL<2>, and the data input/output control unit 740 does not select flag page buffers among the N number of flag page buffers 710<1:N> that are not included in the second group.

Namely, the data input/output control unit 740 causes the flag page buffers selected in correspondence to the flag area FLAG AREA of the even page PAGE1_EVEN and the odd page PAGE1_ODD included in the first word line WL<1> among the N number of flag page buffers 710<1:N> for performing an operation for inputting/outputting the flag data FLG_DATA<1:N> and the flag page buffers selected in correspondence to the flag area FLAG AREA of the even page PAGE2_EVEN and the odd page PAGE2_ODD included in the second word line WL<2> not to overlap with each other.

In other words, the data input/output control unit 740 selects (enables) R number of flag page buffers among the N number of flag page buffers 710<1:N> that are not adjacent to one another in correspondence to the flag area FLAG AREA of the even page PAGE1_EVEN and the odd page PAGE1_ODD included in the first word line WL<1> such that R-bit flag data is inputted/outputted, and the data input/output control unit 740 does not select (disables) N−R number of flag page buffers such that flag data is not inputted/outputted.

Conversely, the data input/output control unit 740 selects (enables) N−R number of flag page buffers among the N number of flag page buffers 710<1:N> that are not adjacent to one another in correspondence to the flag area FLAG AREA of the even page PAGE2_EVEN and the odd page PAGE2_ODD included in the second word line WL<2> such that (N−R)-bit flag data is inputted/outputted, and the data input/output control unit 740 does not select (disables) R number of flag page buffers such that flag data is not inputted/outputted.

For example, when the nonvolatile memory cells FCE1<1:N> and FCO1<1:N> included by the number of N in the flag area FLAG AREA of the even page PAGE1_EVEN and the odd page PAGE1_ODD of the first word line WL<1> are selected and an operation for inputting/outputting the flag data FLG_DATA<1:N> is performed, the data input/output control unit 740 selects odd-numbered flag page buffers 710<1>, 710<3>, 710<5>, . . . and 710<N−1> among the N number of flag page buffers 710<1:N> such that N/2-bit flag data FLG_DATA<1>, FLG_DATA<3>, FLG_DATA<5>, . . . and FLG_DATA<N−1> is inputted and outputted to and from the odd-numbered nonvolatile memory cells FCE1<1>, FCE1<3>, FCE1<5>, . . . and FCE1<N−1> and FCO1<1>, FCO1<3>, FCO1<5>, . . . and FCO1<N−1> among the nonvolatile memory cells FCE1<1:N> and FCO1<1:N> included by the number of N in the flag area FLAG AREA of the even page PAGE1_EVEN and the odd page PAGE1_ODD of the first word line WL<1>, and such that flag data is not inputted and outputted to and from the unselected even-numbered flag page buffers 710<2>, 710<4>, 710<6>, . . . and 710<N>. Thereafter, when the nonvolatile memory cells FCE2<1:N> and FCO2<1:N> included by the number of N in the flag area FLAG AREA of the even page PAGE2_EVEN and the odd page PAGE2_ODD of the second word line WL<2> are selected and an operation for inputting/outputting the flag data FLG_DATA<1:N> is performed, the data input/output control unit 740 selects even-numbered flag page buffers 710<2>, 710<4>, 710<6>, . . . and 710<N> among the N number of flag page buffers 710<1:N> such that N/2-bit flag data FLG_DATA<2>, FLG_DATA<4>, FLG_DATA<6>, . . . and FLG_DATA<N> is inputted and outputted to and from the even-numbered nonvolatile memory cells FCE2<2>, FCE2<4>, FCE2<6>, . . . and FCE2<N> and FCO2<2>, FCO2<4>, FCO2<6>, . . . and FCO2<N> among the nonvolatile memory cells FCE2<1:N> and FCO2<1:N> included by the number of N in the flag area FLAG AREA of the even page PAGE2_EVEN and the odd page PAGE2_ODD of the second word line WL<2>, and such that flag data is not inputted and outputted to and from the unselected odd-numbered flag page buffers 710<1>, 710<3>, 710<5>, . . . and 710<N−1>.

Conversely, when the nonvolatile memory cells FCE1<1:N> and FCO1<1:N> included by the number of N in the flag area FLAG AREA of the even page PAGE1_EVEN and the odd page PAGE1_ODD of the first word line WL<1> are selected and, an operation for inputting/outputting the flag data FLG_DATA<1:N> is performed, the data input/output control unit 740 selects even-numbered flag page buffers 710<2>, 710<4>, 710<6>, . . . and 710<N> among the N number of flag page buffers 710<1:N> such that N/2-bit flag data FLG_DATA<2>, FLG_DATA<4>, FLG_DATA<6>, . . . and FLG_DATA<N> is inputted and outputted to and from the even-numbered nonvolatile memory cells FCE1<2>, FCE1<4>, FCE1<6>, . . . and FCE1<N> and FCO1<2>, FCO1<4>, FCO1<6>, . . . and FCO1<N> among the nonvolatile memory cells FCE1<1:N> and FCO1<1:N> included by the number of N in the flag area FLAG AREA of the even page PAGE1_EVEN and the odd page PAGE1_ODD of the first word line WL<1>, and such that flag data is not inputted and outputted to and from the unselected even-numbered flag page buffers 710<1>, 710<3>, 710<5>, . . . and 710<N-1>. Thereafter, when the nonvolatile memory cells FCE2<1:N> and FCO2<1:N> included by the number of N in the flag area FLAG AREA of the even page PAGE2_EVEN and the odd page PAGE2_ODD of the second word line WL<2> are selected and an operation for inputting/outputting the flag data FLG_DATA<1:N> is performed, the data input/output control unit 740 selects odd-numbered flag page buffers 710<1>, 710<3>, 710<5>, . . . and 710<N-1> among the N number of flag page buffers 710<1:N> such that N/2-bit flag data FLG_DATA<1>, FLG_DATA<3>, FLG_DATA<5>, . . . and FLG_DATA<N-1> is inputted and outputted to and from the odd-numbered nonvolatile memory cells FCE2<1>, FCE2<3>, FCE2<5>, . . . and FCE2<N-1> and FCO2<1>, FCO2<3>, FCO2<5>, . . . and FCO2<N-1> among the nonvolatile memory cells FCE2<1:N> and FCO2<1:N> included by the number of N in the flag area FLAG AREA of the even page PAGE2_EVEN and the odd page PAGE2_ODD of the second word line WL<2>, and such that flag data is not inputted and outputted to and from the unselected even-numbered flag page buffers 710<2>, 710<4>, 710<6>, . . . and 710<N>.

In order to operate the data input/output control unit 740 as described above, a method of controlling the values of first cell select control signals W1_CS_CNTLE<M+1:M+N> and W1_CS_CNTLO<M+1:M+N> capable of respectively selecting the N number of nonvolatile memory cells FCE1<1:N> and FCO1<1:N> included in the flag area FLAG AREA of the even page PAGE1_EVEN and the odd page PAGE1_ODD of the first word line WL<1> and controlling the values of second cell select control signals W2_CS_CNTLE<M+1:M+N> and W2_CS_CNTLO<M+1:M+N> capable of respectively selecting the N number of nonvolatile memory cells FCE2<1:N> and FCO2<1:N> included in the flag area FLAG AREA of the even page PAGE2_EVEN and the odd page PAGE2_ODD of the second word line WL<2> may be used.

More specifically, by controlling the values of the first cell select control signals W1_CS_CNTLE<M+1:M+N> and W1_CS_CNTLO<M+1:M+N> and the second cell select control signals W2_CS_CNTLE<M+1:M+N> and W2_CS_CNTLO<M+1:M+N>, the odd-numbered flag page buffers 710<1>, 710<3>, 710<5>, . . . and 710<N-1> among the N number of flag page buffers 710<1:N> may input/output the N/2-bit flag data FLG_DATA<1>, FLG_DATA<3>, FLG_DATA<5>, . . . and FLG_DATA<N-1> in correspondence to the flag area FLAG AREA of the even page PAGE1_EVEN and the odd page PAGE1_ODD included in the first word line WL<1>, and the even-numbered flag page buffers 710<2>, 710<4>, 710<6>, . . . and 710<N> among the N number of flag page buffers 710<1:N> may input/output the N/2-bit flag data FLG_DATA<2>, FLG_DATA<4>, FLG_ DATA<6>, . . . and FLG_DATA<N> in correspondence to the flag area FLAG AREA of the even page PAGE2_EVEN and the odd page PAGE2_ODD included in the second word line WL<2>.

Conversely, by controlling the values of the first cell select control signals W1_CS_CNTLE<M+1:M+N> and W1_CS_CNTLO<M+1:M+N> and the second cell select control signals W2_CS_CNTLE<M+1:M+N> and W2_CS_CNTLO<M+1:M+N>, the even-numbered flag page buffers 710<2>, 710<4>, 710<6>, . . . and 710<N> among the N number of flag page buffers 710<1:N> may input/output the N/2-bit flag data FLG_DATA<2>, FLG_DATA<4>, FLG_DATA<6>, . . . and FLG_DATA<N> in correspondence to the flag area FLAG AREA of the even page PAGE1_EVEN and the odd page PAGE1_ODD included in the first word line WL<1>, and the odd-numbered flag page buffers 710<1>, 710<3>, 710<5>, . . . and 710<N-1> among the N number of flag page buffers 710<1:N> may input/output the N/2-bit flag data FLG_DATA<1>, FLG_DATA<3>, FLG_DATA<5>, . . . and FLG_DATA<N-1> in correspondence to the flag area FLAG AREA of the even page PAGE2_EVEN and the odd page PAGE2_ODD included in the second word line WL<2>.

For example, as shown in FIG. 8C, if first even-numbered cell select control signals W1_CS_CNTLE<1:8> with values of '1 1 0 1 1 1 0 1' are applied, first odd-numbered cell select control signals W1_CS_CNTLO<1:8> with values of '0 1 1 1 0 1 1 1' are applied, second even-numbered cell select control signals W2_CS_CNTLE<1:8> with values of '1 1 1 0 1 1 1 0' are applied, and second odd-numbered cell select control signals W2_CS_CNTLO<1:8> with values of '1 0 1 1 1 0 1 1' are applied, third and seventh nonvolatile memory cells FCE1<3> and FCE1<7> are selected among eight nonvolatile memory cells FCE1<1:8> included in the flag area FLAG AREA of the even page PAGE1_EVEN of the first word line WL<1>, and the corresponding 2-bit flag data FLG_DATA<3> and FLG_DATA<7> are inputted and outputted through the third and seventh flag page buffers 710<3> and 710<7> corresponding to the third and seventh nonvolatile memory cells FCE1<3> and FCE1<7>, first and fifth nonvolatile memory cells FCO1<1> and FCO1<5> are selected among eight nonvolatile memory cells FCO1<1:8> included in the flag area FLAG AREA of the odd page PAGE1_ODD of the first word line WL<1>, and the corresponding 2-bit flag data FLG_DATA<1> and FLG_DATA<5> are inputted and outputted through the first and fifth flag page buffers 710<1> and 710<5> corresponding to the first and fifth nonvolatile memory cells FCO1<1> and FCO1<5>, fourth and eighth nonvolatile memory cells FCE2<4> and FCE2<8> are selected among eight nonvolatile memory cells FCE2<1:8> included in the flag area FLAG AREA of the even page PAGE2_EVEN of the second word line WL<2>, and the corresponding 2-bit flag data FLG_DATA<4> and FLG_DATA<8> are inputted and outputted through the fourth and eighth flag page buffers 710<4> and 710<8> corresponding to the fourth and eighth nonvolatile memory cells FCE2<4> and FCE2<8>, and second and sixth nonvolatile memory cells FCO2<2> and FCO2<6> are selected among eight nonvolatile memory cells FCO2<1:8> included in the flag area FLAG AREA of the odd page PAGE2_ODD of the second word line WL<2>, and the corresponding 2-bit flag data FLG_ DATA<2> and FLG_DATA<6> are inputted and outputted through the second and sixth flag page buffers 710<2> and 710<6> corresponding to the second and sixth nonvolatile memory cells FCO2<2> and FCO2<6>.

More specifically, in correspondence to the third and seventh nonvolatile memory cells FCE1<3> and FCE1<7> of the even page PAGE1_EVEN and the first and fifth nonvolatile memory cells FCO1<1> and FCO1<5> of the odd page PAGE1_ODD among the nonvolatile memory cells FCE1<1:8> and FCO1<1:8> included in the flag area FLAG AREA of the even page PAGE1_EVEN and the odd page PAGE1_ODD included in the first word line WL<1>, the 4-bit flag data FLG_DATA<1>, FLG_DATA<3>, FLG_DATA<5> and FLG_DATA<7> is inputted and outputted through the odd-numbered flag page buffers 710<1>, 710<3>, 710<5> and 710<7> among the eight flag page buffers 710<1:8>, and in correspondence to the fourth and eighth nonvolatile memory cells FCE2<4> and FCE2<8> of the even page PAGE2_EVEN and the second and sixth nonvolatile memory cells FCO2<2> and FCO2<6> of the odd page PAGE2_ODD among the nonvolatile memory cells FCE2<1:8> and FCO2<1:8> included in the flag area FLAG AREA of the even page PAGE2_EVEN and the odd page PAGE2_ODD included in the second word line WL<2>, the 4-bit flag data FLG_DATA<2>, FLG_DATA<4>, FLG_DATA<6> and FLG_DATA<8> is inputted and outputted through the odd-numbered flag page buffers 710<2>, 710<4>, 710<6> and 710<8> among the eight flag page buffers 710<1:8>.

At this time, no flag data is inputted and outputted through the even-numbered flag page buffers 710<2>, 710<4>, 710<6> and 710<8> among the eight flag page buffers 710<1:8> corresponding to the flag area FLAG AREA of the even page PAGE1_EVEN and the odd page PAGE1_ODD included in the first word line WL<1>, and no flag data is inputted and outputted through the even-numbered flag page buffers 710<1>, 710<3>, 710<5> and 710<7> among the eight flag page buffers 710<1:8> corresponding to the flag area FLAG AREA of the even page PAGE2_EVEN and the odd page PAGE2_ODD included in the second word line WL<2>.

Accordingly, among the eight nonvolatile memory cells FCE1<1:8> and FCO1<1:8> included respectively in the flag area FLAG AREA of the even page PAGE1_EVEN and the odd page PAGE1_ODD included in the first word line WL<1>, the cells FCE1<1>, FCO1<2>, FCE1<2>, FCO1<3>, FCO1<4>, FCE1<4>, FCE1<5>, FCO1<6>, FCE1<6>, FCO1<7>, FCO1<8>, and FCE1<8> in which no data is stored exist between the cells FCO1<1>, FCE1<3>, FCO1<5> and FCE1<7> in which the 4-bit flag data FLG_DATA<1>, FLG_DATA<3>, FLG_DATA<5>, and FLG_DATA<7> is stored. In this configuration, the occurrence of an interference phenomenon between adjacent cells may be minimized while the 4-bit flag data FLG_DATA<1>, FLG_DATA<3>, FLG_DATA<5>, and FLG_DATA<7> is stored, and, among the eight nonvolatile memory cells FCE2<1:8> and FCO2<1:8> included respectively in the flag area FLAG AREA of the even page PAGE2_EVEN and the odd page PAGE2_ODD included in the second word line WL<2>, the cells FCO2<1>, FCE2<1>, FCE2<2>, FCO2<3>, FCE2<3>, FCO2<4>, FCO2<5>, FCE2<5>, FCE2<6>, FCO2<7>, FCE2<7>, and FCO2<8> in which no data is stored exist between the cells FCO2<2>, FCE2<4>, FCO2<6>, and FCE2<8> in which the 4-bit flag data FLG_DATA<2>, FLG_DATA<4>, FLG_DATA<6> and FLG_DATA<8> is stored. In this configuration, the occurrence of an interference phenomenon between adjacent cells may be minimized while the 4-bit flag data FLG_DATA<2>, FLG_DATA<4>, FLG_DATA<6> and FLG_DATA<8> is stored.

Also, no flag data is stored in the cells FCO2<1>, FCE2<3>, FCO2<5>, and FCE2<7>, which are included in the second word line WL<2> and correspond to the cells FCO1<1>, FCE1<3>, FCO1<5>, and FCE1<7> where the 4-bit flag data FLG_DATA<1>, FLG_DATA<3>, FLG_DATA<5> and FLG_DATA<7> is stored in the first word line WL<1>. In this configuration, the occurrence of an interference phenomenon between adjacent cells may be minimized while the 4-bit flag data FLG_DATA<1>, FLG_DATA<3>, FLG_DATA<5>, and FLG_DATA<7> is stored in the first word line WL<1>, and no flag data is stored in the cells FCO1<2>, FCE1<4>, FCO1<6> and FCE1<8>, which are included in the first word line WL<1> and correspond to the cells FCO2<2>, FCE2<4>, FCO2<6>, and FCE2<8> where the 4-bit flag data FLG_DATA<2>, FLG_DATA<4>, FLG_DATA<6>, and FLG_DATA<8> is stored in the second word line WL<2>. Also in this configuration, the occurrence of an interference phenomenon between adjacent cells may be minimized while the 4-bit flag data FLG_DATA<2>, FLG_DATA<4>, FLG_DATA<6>, and FLG_DATA<8> are stored in the second word line WL<2>.

Figure 9C:
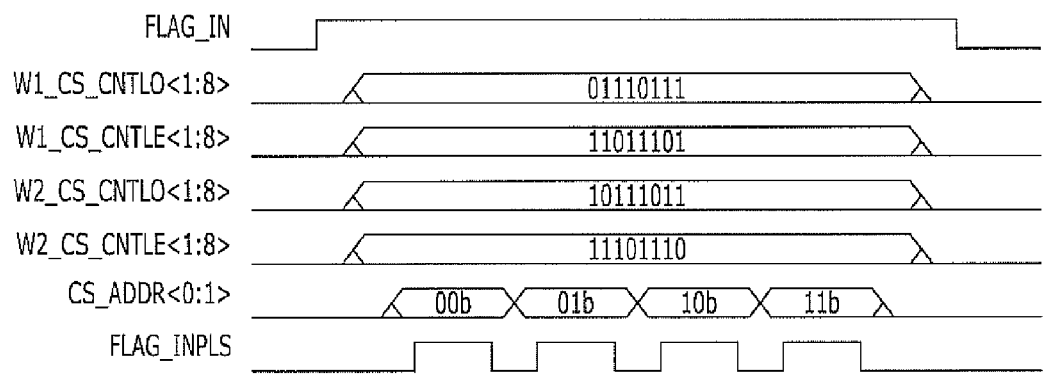

In this way, when the number of nonvolatile memory cells included in the flag area FLAG AREA of the even page PAGE_EVEN included in the first word line WL<1> and the second word line WL<2> is increased to 32 as FCE1<1:32> and FCE2<1:32> and the number of nonvolatile memory cells included in the flag area FLAG AREA of the odd page PAGE_ODD included in the first word line WL<1> and the second word line WL<2> is increased to 32 as FCO1<1:32> and FCO2<1:32>, as shown in FIG. 9C, through a method of counting cell select addresses CS_ADDR<0:1> in the sequence of 00b, 01b, 10b and 11b with the values of the first cell select control signals W1_CS_CNTLE<1:8> and W1_CS_CNTLO<1:8> and the second cell select control signals W2_CS_CNTLE<1:8> and W2_CS_CNTLO<1:8> controlled, odd-numbered flag page buffers 710<1>, 710<3>, 710<5>, . . . and 710<31> among thirty-two flag page buffers 710<1:32> included in the flag area FLAG AREA of the even page PAGE1_EVEN and the odd page PAGE1_ODD included in the first word line WL<1> may input/output 16-bit flag data FLG_DATA<1>, FLG_DATA<3>, FLG_DATA<5>, . . . and FLG_DATA<31>, and even-numbered flag page buffers 710<2>, 710<4>, 710<6>, . . . and 710<32> among the thirty-two flag page buffers 710<1:32> included in the flag area FLAG AREA of the even page PAGE2_EVEN and the odd page PAGE2_ODD included in the second word line WL<2> may input/output 16-bit flag data FLG_DATA<2>, FLG_DATA<4>, FLG_DATA<6>, . . . and FLG_DATA<32>.

The normal data NR_DATA<1:M> may be stored by multiple bits in the 2*M number of nonvolatile memory cells NCE1<1:M> and NCO1<1:M> or NCE2<1:M> and NCO2<1:M> included in the normal area NORMAL AREA of the even page PAGE_EVEN and the odd page PAGE_ODD included in the first word line WL<1> or the second word line WL<2>, and the flag data FLG_DATA<1:N> may be stored each by two bits in the 2*N number of nonvolatile memory cells FCE1<1:N> and FCO1<1:N> or FCE2<1:N> and FCO2<1:N> included in the flag area FLAG AREA of the even page PAGE_EVEN and the odd page PAGE_ODD included in the first word line WL<1> or the second word line WL<2>. More specifically, in the normal data NR_DATA<1:M>, since an amount of data to be stored is an important goal, a configuration capable of storing more data may be used, and the flag data FLG_DATA<1:N>, since accuracy of data to be read is an important goal, a configuration with less probability of an error occurring may be used.

FIG. 10A illustrates an example of a threshold voltage distribution of the 2*M number of nonvolatile memory cells NCE1<1:M> and NCO1<1:M> or NCE2<1:M> and NCO2<1:M> included in the normal area NORMAL AREA, and FIG. 10B illustrates an example of a threshold voltage distribution of the 2*N number of nonvolatile memory cells FCE1<1:N> and FCO1<1:N> or FCE2<1:N> and FCO2<1:N> included in the flag area FLAG AREA.

Referring to FIG. 10B, the initial state of the 2*N number of nonvolatile memory cells FCE1<1:N> and FCO1<1:N> or FCE2<1:N> and FCO2<1:N> included in the flag area FLAG AREA corresponds, for example, to a case in which the flag data FLG_DATA<1:N> becomes "1" (=an erased state). This state represents, for example, a state in which writing of the normal data NR_DATA<1:M> to be stored in the normal area NORMAL AREA is not completed. In this way, by reading the flag data FLG_DATA<1:N> from the 2*N number of nonvolatile memory cells FCE1<1:N> and FCO1<1:N> or FCE2<1:N> and FCO2<1:N> included in the flag area FLAG AREA, if the values of the flag data FLG_DATA<1:N> are "1", the writing of the normal data NR_DATA<1:M> to be stored in the normal area NORMAL AREA is not completed.

Thereafter, if the writing of the normal data NR_DATA<1:M> to be stored in the normal area NORMAL AREA is completed, electrons are introduced into the floating gates of cells (odd-numbered or even-numbered cells) selected among the 2*N number of nonvolatile memory cells FCE1<1:N> and FCO1<1:N> or FCE2<1:N> and FCO2<1:N> included in the flag area FLAG AREA, and the threshold values of the flag cells are raised from the erased state of "1" to a written state of "0". By reading the flag data FLG_DATA<1, 3, 5, . . . , N−1> or FLG_DATA<2, 4, 6, . . . , N> from the cells selected among the 2*N number of nonvolatile memory cells FCE1<1:N> and FCO1<1:N> or FCE2<1:N> and FCO2<1:N> included in the flag area FLAG AREA, whether the writing of the normal data NR_DATA<1:M> to be stored in the normal area NORMAL AREA is completed may be determined.

In addition, when the values of the flag data FLG_DATA<1, 3, 5, . . . , N−1> or FLG_DATA<2, 4, 6, . . . , N> read from the cells selected among the 2*N number of nonvolatile memory cells FCE1<1:N> and FCO1<1:N> or FCE2<1:N> and FCO2<1:N> included in the flag area FLAG AREA are "0", the values of the flag data FLG_DATA<2, 4, 6, . . . , N> or FLG_DATA<1, 3, 5, . . . , N−1> read from the unselected cells may be maintained as "1".

However, if the values of the flag data FLG_DATA<2, 4, 6, . . . , N> or FLG_DATA<1, 3, 5, . . . , N−1> read from the unselected cells become "0", an interference phenomenon has occurred in the unselected cells.

In this way, if the interference phenomenon is known by reading the values of the flag data FLG_DATA<2, 4, 6, . . . , N> or FLG_DATA<1, 3, 5, . . . , N−1> from the unselected cells, the interference phenomenon may be offset through a method of controlling the level of a read reference voltage Vread while reading the flag data FLG_DATA<1, 3, 5, . . . , N−1> or FLG_DATA<2, 4, 6, . . . , N> of the selected cells.

According to the embodiments of the present invention, in a nonvolatile memory device where K number of pages are included in one word line, and each page includes a normal area and a flag area in which N (N is an integer equal to or greater than 2) number of nonvolatile memory cells are disposed, N number of flag page buffers, to each of which K number of nonvolatile memory cells among K*N number of nonvolatile memory cells corresponding to respective flag areas of the K number of pages are connected, are controlled such that adjacent flag page buffers are not simultaneously enabled. The configuration of the embodiments of the present invention prevent accuracy of flag data inputted to and outputted from the nonvolatile memory cells from being degraded due to an interference phenomenon between nonvolatile memory cells that are adjacent in a column direction.

Also, according to the embodiments of the present invention, in a nonvolatile memory device including a first word line and a second word line, where each word line includes K number of pages, flag page buffers enabled in correspondence to the first word line and flag page buffers enabled in correspondence to the second word line are controlled in such a way as not to overlap with each other. This configuration prevents accuracy of flag data inputted to and outputted from nonvolatile memory cells from being degraded due to an interference phenomenon between nonvolatile memory cells that are adjacent in a row direction While the present invention has been described with respect to the specific embodiments, it will be apparent to those skilled in the art that various changes and modifications may be made without departing from the spirit and scope of the invention as defined in the following claims.

What is claimed is:

1. A nonvolatile memory device comprising:
N (N is an integer equal to or greater than 2) number of nonvolatile memory cells disposed in a flag area of a page;
N number of flag page buffers configured to input and output flag data to and from the nonvolatile memory cells of the flag area; and
a data input/output control unit configured to select R number of flag page buffers so that the flag data is inputted and outputted from the R selected flag page buffers and no flag data is inputted and outputted through unselected N−R number of flag page buffers, wherein no one flag page buffer of the R selected flag page buffers is immediately adjacent to another one of the R selected flag page buffers.

2. The nonvolatile memory device of claim 1, wherein the data input/output control unit selects odd-numbered or even-numbered flag page buffers among the N number of flag page buffers.

3. The nonvolatile memory device of claim 2, further comprising:
M (M is an integer equal to or greater than 2) number of nonvolatile memory cells disposed in a normal area of the nonvolatile memory device; and
M number of normal page buffers configured to input and output normal data to and from the nonvolatile memory cells of the normal area,
wherein the page further includes the normal area,
wherein the data input/output control unit selects all the M number of normal page buffers and inputs and outputs the normal data.

4. The nonvolatile memory device of claim 3, wherein the data input/output control unit inputs and outputs the flag data to and from odd-numbered or even-numbered flag page buffers among the N number of flag page buffers by controlling values of cell select control signals respectively corresponding to the N number of nonvolatile memory cells.

5. The nonvolatile memory device of claim 3,
wherein the normal data is changed in value in response to a user, and
wherein the flag data is changed in value in response to a current state of the normal area included in the page.

6. The nonvolatile memory device of claim 3,
wherein the normal data is recorded in the M number of nonvolatile memory cells by the unit of multiple bits, and
wherein the flag data is stored in the N number of nonvolatile memory cells by the unit of 2 bits.

7. A nonvolatile memory device comprising:
K (K is an integer equal to or greater than 1) number of pages each including N (N is an integer equal to or greater than 2) number of nonvolatile memory cells disposed in a flag area, wherein the K number of pages are accessed by a word line;
N number of flag page buffers configured to input and output flag data to and from K*N number of nonvolatile memory cells in correspondence to the flag areas of the K number of pages; and a data input/output control unit configured to select R number of flag page buffers so that the flag data is inputted and outputted from the R selected flag page buffers and no flag data is inputted and outputted through unselected N−R number of flag page buffers, wherein no one flag page buffer of the R selected flag page buffers is immediately adjacent to another one of the R selected flag page buffers.

8. The nonvolatile memory device of claim 7, wherein the M number of normal page buffers alternately select the M number of nonvolatile memory cells included in the respective normal areas of the K number of pages to input and output the normal data to and from M number of nonvolatile memory cells that are included in the normal areas of the K number of pages.

9. The nonvolatile memory device of claim 8, wherein the N number of flag page buffers alternately select the N number of nonvolatile memory cells included in the respective flag areas of the K number of pages to input and output the flag data to and from N number of nonvolatile memory cells that are included in the flag areas of the K number of pages.

10. The nonvolatile memory device of claim 9, wherein the data input/output control unit selects odd-numbered or even-numbered flag page buffers among the N number of flag page buffers so that N/2-bit flag data is simultaneously inputted and outputted.

11. The nonvolatile memory device of claim 10, further comprising:
M (M is an integer equal to or greater than 2) number of nonvolatile memory cells disposed in a normal area of the nonvolatile memory device; and
M number of normal page buffers configured to input and output normal data to and from K*M number of nonvolatile memory cells in correspondence to the normal areas of the K number of pages,
wherein each page further includes the corresponding normal area,
wherein the data input/output control unit selects all the M number of normal page buffers and simultaneously inputs and outputs M-bit normal data.

12. The nonvolatile memory device of claim 11, wherein the data input/output control unit inputs and outputs N/2-bit flag data to and from odd-numbered or even-numbered flag page buffers among the N number of flag page buffers by controlling values of cell select control signals applied K number of times in respective correspondence to the N number of nonvolatile memory cells included in each of the flag areas of the K number of pages.

13. The nonvolatile memory device of claim 11,
wherein the normal data is changed in value in response to a user, and
wherein the flag data is changed in value in response to a current state of each of the normal areas included in the K number of pages.

14. A nonvolatile memory device comprising:
a first word line accessing K (K is an integer equal to or greater than 1) number of pages each including N (N is an integer equal to or greater than 2) number of nonvolatile memory cells disposed in a corresponding flag area;
a second word line accessing K number of pages each including N number of nonvolatile memory cells disposed in a corresponding flag area, wherein the second word line is adjacent to the first word line;
N number of flag page buffers configured to input and output flag data to and from K*N number of nonvolatile memory cells in correspondence to the flag areas of the K number of pages accessed by the first word line or the second word line; and
a data input/output control unit configured to select a first group of flag page buffers in the flag areas of the K number of pages accessed by the first word line and select a second group of flag page buffers in the flag areas of the K number of pages accessed by the second word line so that the flag data is inputted and outputted from the first and second group of selected flag page buffers and no flag data is inputted and outputted through unselected flag page buffers, wherein no one flag page buffer of the first group is immediately adjacent to another one of the first group of selected flag page buffers, and no one flag page buffer of the second group is immediately adjacent to another one of the second group of selected flag page buffers.

15. The nonvolatile memory device of claim 14, further comprising:
M (M is an integer equal to or greater than 2) number of nonvolatile memory cells disposed in a normal area of the nonvolatile memory device; and
M number of normal page buffers configured to input and output normal data to and from K*M number of nonvolatile memory cells in correspondence to the normal areas of the K number of pages accessed by the first word line or the second word line,
wherein each page accessed by the first word line or the second word line further includes the corresponding normal area.

16. The nonvolatile memory device of claim 15,
wherein the M number of normal page buffers alternately select the M number of nonvolatile memory cells included in the respective normal areas of the K number of pages accessed by the first word line to input and output the normal data to and from M number of nonvolatile memory cells that are included in the normal areas of the K number of pages accessed by the first word line, and
wherein the M number of normal page buffers alternately select the M number of nonvolatile memory cells included in the respective normal areas of the K number of pages accessed by the second word line to input and output the normal data to and from M number of nonvolatile memory cells that are included in the normal areas of the K number of pages accessed by the second word line.

17. The nonvolatile memory device of claim 16,
wherein the N number of flag page buffers alternately select the N number of nonvolatile memory cells included in the respective flag areas of the K number of pages accessed by the first word line to input and output the flag data to and from N number of nonvolatile memory cells that are included in the flag areas of the K number of pages accessed by the first word line, and
wherein the N number of flag page buffers alternately select the N number of nonvolatile memory cells included in the respective flag areas of the K number of pages accessed by the second word line to input and output the flag data to and from N number of nonvolatile memory cells that are included in the flag areas of the K number of pages accessed by the second word line.

18. The nonvolatile memory device of claim 17,
wherein the data input/output control unit selects odd-numbered or even-numbered flag page buffers in correspondence to the flag areas of the K number of pages accessed by the first word line so that N/2-bit flag data is simultaneously inputted and outputted, and wherein the data input/output control unit selects even-numbered or odd-numbered flag page buffers in correspondence to the flag areas of the K number of pages accessed by the second word line so that N/2-bit flag data is simultaneously inputted and outputted.

19. The nonvolatile memory device of claim 18, wherein the data input/output control unit selects all the M number of normal page buffers and simultaneously inputs and outputs M-bit normal data in correspondence to the normal areas of the K number of pages accessed by the first word line, and wherein the data input/output control unit selects all the M number of normal page buffers and simultaneously inputs and outputs M-bit normal data in correspondence to the normal areas of the K number of pages accessed by the second word line.

20. The nonvolatile memory device of claim 19, wherein the data input/output control unit inputs and outputs N/2-bit flag data to and from odd-numbered or even-numbered flag page buffers by controlling values of first cell select control signals applied K number of times in respective correspondence to the N number of nonvolatile memory cells included in each of the flag areas of the K number of pages accessed by the first word line, and wherein the data input/output control unit inputs and outputs N/2-bit flag data to and from odd-numbered or even-numbered flag page buffers by controlling values of second cell select control signals applied K number of times in respective correspondence to the N number of nonvolatile memory cells included in each of the flag areas of the K number of pages accessed by the second word line.

21. The nonvolatile memory device of claim 15, wherein the normal data is changed in value in response to a user, and wherein the flag data inputted to and outputted from the flag areas included in the K number of pages accessed by the first word line is changed in value in response to a current state of each of the normal areas included in the K number of pages accessed by the first word line, and wherein the flag data inputted to and outputted from the flag areas included in the K number of pages accessed by the second word line is changed in value in response to a current state of each of the normal areas included in the K number of pages accessed by the second word line.

* * * * *